United States Patent
Lee et al.

(10) Patent No.: US 10,204,985 B2
(45) Date of Patent: Feb. 12, 2019

(54) STRUCTURE AND FORMATION METHOD OF SEMICONDUCTOR DEVICE STRUCTURE

(71) Applicant: Taiwan Semiconductor Manufacturing Co., Ltd., Hsinchu (TW)

(72) Inventors: Tung-Ying Lee, Hsinchu (TW); Chih-Chieh Yeh, Taipei (TW); Chen-Feng Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/942,639

(22) Filed: Nov. 16, 2015

(65) Prior Publication Data
US 2017/0141188 A1    May 18, 2017

(51) Int. Cl.
| H01L 29/06 | (2006.01) |
| H01L 21/306 | (2006.01) |
| H01L 21/84 | (2006.01) |
| H01L 27/12 | (2006.01) |
| H01L 29/423 | (2006.01) |
| H01L 29/66 | (2006.01) |

(52) U.S. Cl.
CPC .... *H01L 29/0673* (2013.01); *H01L 21/30604* (2013.01); *H01L 21/845* (2013.01); *H01L 27/1211* (2013.01); *H01L 29/42392* (2013.01); *H01L 29/66439* (2013.01)

(58) Field of Classification Search
CPC .......... H01L 29/0673; H01L 21/30604; H01L 21/845; H01L 27/1211; H01L 29/66439; H01L 29/42392
See application file for complete search history.

(56) References Cited

U.S. PATENT DOCUMENTS

| 7,374,986 B2* | 5/2008 | Kim ................. H01L 29/78696 257/210 |
| 7,642,578 B2* | 1/2010 | Lee ........................ B82Y 10/00 257/288 |
| 7,795,687 B2* | 9/2010 | Suk ..................... H01L 29/0673 257/347 |
| 9,257,527 B2* | 2/2016 | Hashemi ........... H01L 29/42392 |
| 9,362,397 B2* | 6/2016 | Hur ..................... H01L 29/7832 |
| 9,431,512 B2* | 8/2016 | Koh ....................... B82Y 10/00 |
| 9,653,580 B2* | 5/2017 | Balakrishnan .... H01L 29/66795 |

(Continued)

*Primary Examiner* — Latanya N Crawford
(74) *Attorney, Agent, or Firm* — Birch, Stewart, Kolasch & Birch, LLP

(57) ABSTRACT

Structures and formation methods of a semiconductor device structure are provided. The semiconductor device structure includes a first semiconductor layer and a second semiconductor layer vertically stacked over a semiconductor substrate. The first semiconductor layer and the second semiconductor layer include different materials. The semiconductor device structure also includes a gate stack covering a first portion of the first semiconductor layer. The semiconductor device structure further includes a spacer element over a sidewall of the gate stack. The spacer element covers the second semiconductor layer and a second portion of the first semiconductor layer. The thickness of the second semiconductor layer is different from the thickness of the second portion.

21 Claims, 19 Drawing Sheets

(56) References Cited

U.S. PATENT DOCUMENTS

| | | | |
|---|---|---|---|
| 2013/0270512 A1* | 10/2013 | Radosavljevic | ............................ H01L 21/823807 257/9 |
| 2013/0279145 A1* | 10/2013 | Then | ................. H01L 29/66431 361/820 |
| 2014/0084239 A1* | 3/2014 | Radosavljevic | .... H01L 29/0665 257/12 |
| 2014/0091360 A1* | 4/2014 | Pillarisetty | .......... H01L 21/8258 257/190 |
| 2014/0167108 A1* | 6/2014 | Rachmady | ........ H01L 29/66742 257/190 |
| 2014/0291726 A1* | 10/2014 | Pillarisetty | .......... H01L 21/8258 257/190 |
| 2015/0372145 A1* | 12/2015 | Cheng | ................. H01L 29/1033 257/288 |

* cited by examiner

STRUCTURE AND FORMATION METHOD OF SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a semiconductor device with nanowires, has been introduced to replace a planar transistor. It is desired to have improvements in this area.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
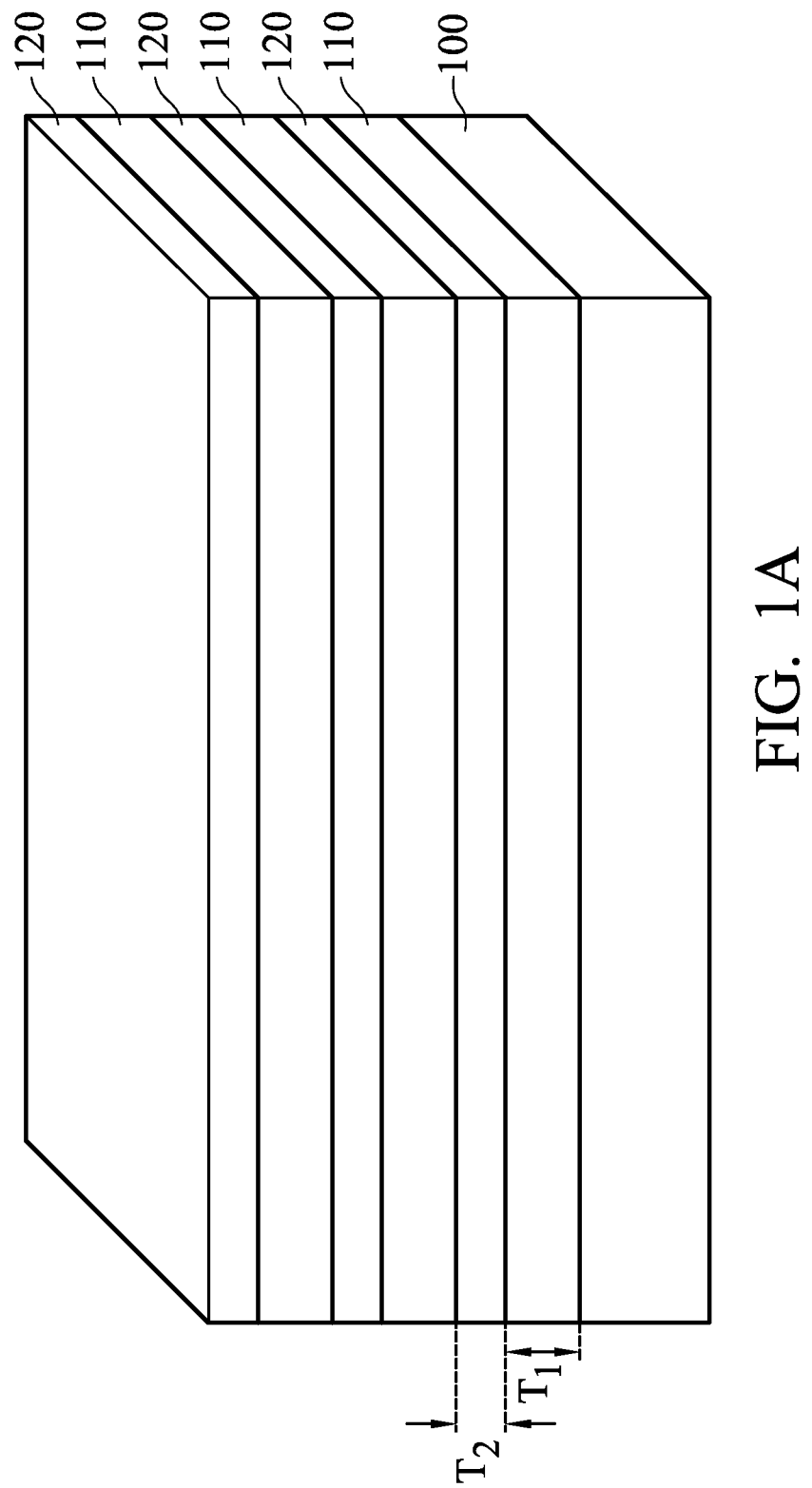
FIGS. 1A-1L are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and they are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1L are perspective views of various stages of a process for forming a semiconductor device structure, in accordance with some embodiments. Additional operations can be provided before, during, and/or after the stages described in FIGS. 1A-1L. Some of the stages that are described can be replaced or eliminated for different embodiments. FIGS. 2A and 2B are cross-sectional views of a semiconductor device structure, in accordance with some embodiments. In some embodiments, FIG. 2A is a cross-sectional view of the semiconductor device structure taken along the line I-I' shown in FIG. 1I. In some embodiments, FIG. 2B is a cross-sectional view of the semiconductor device structure taken along the line I-I' shown in FIG. 1L. Additional features can be added to the semiconductor device structure. Some of the features described below can be replaced or eliminated for different embodiments.

Figure 2A:
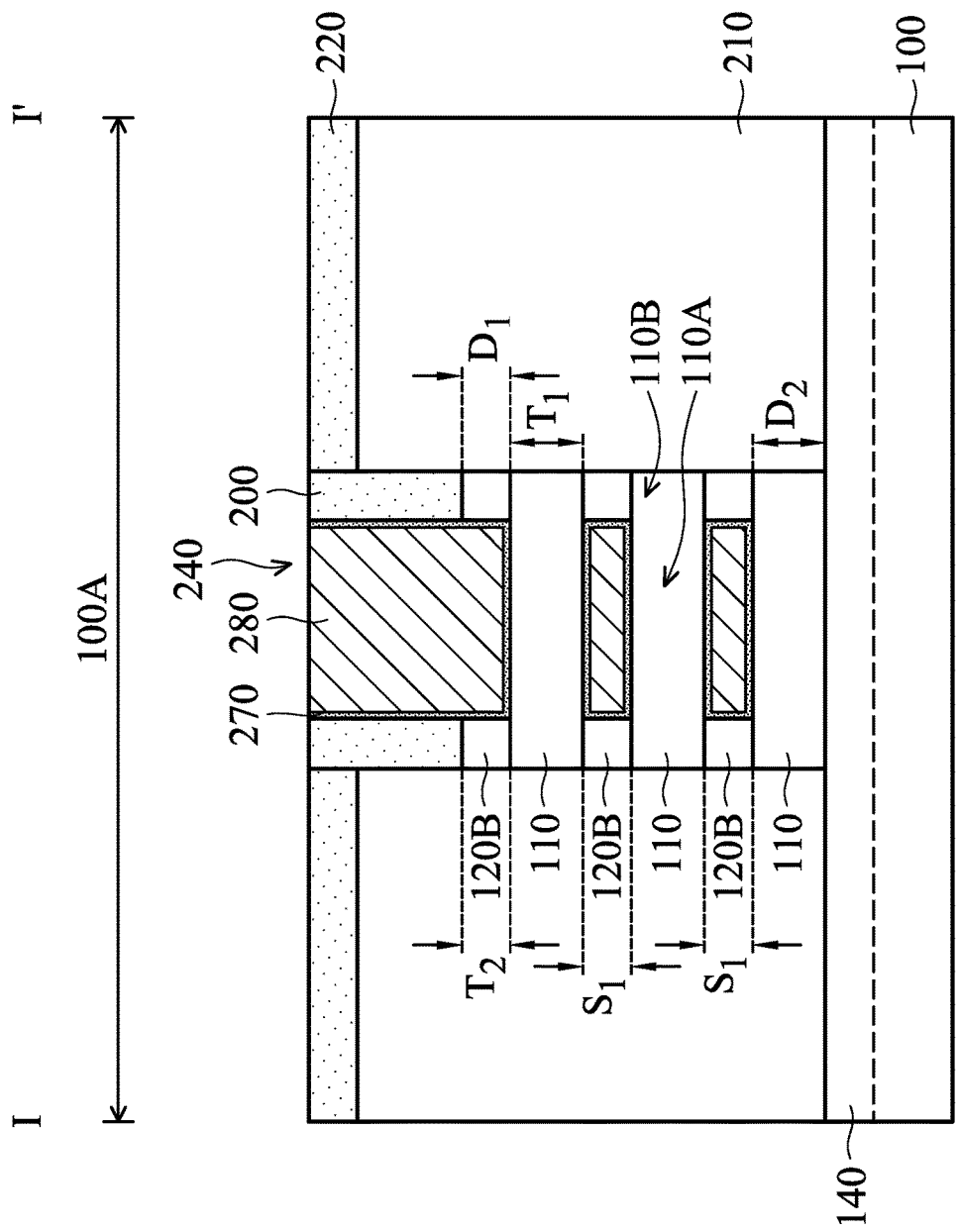
FIGS. 2A-2B are cross-sectional views of a semiconductor device structure, in accordance with some embodiments.
Figure 2B:
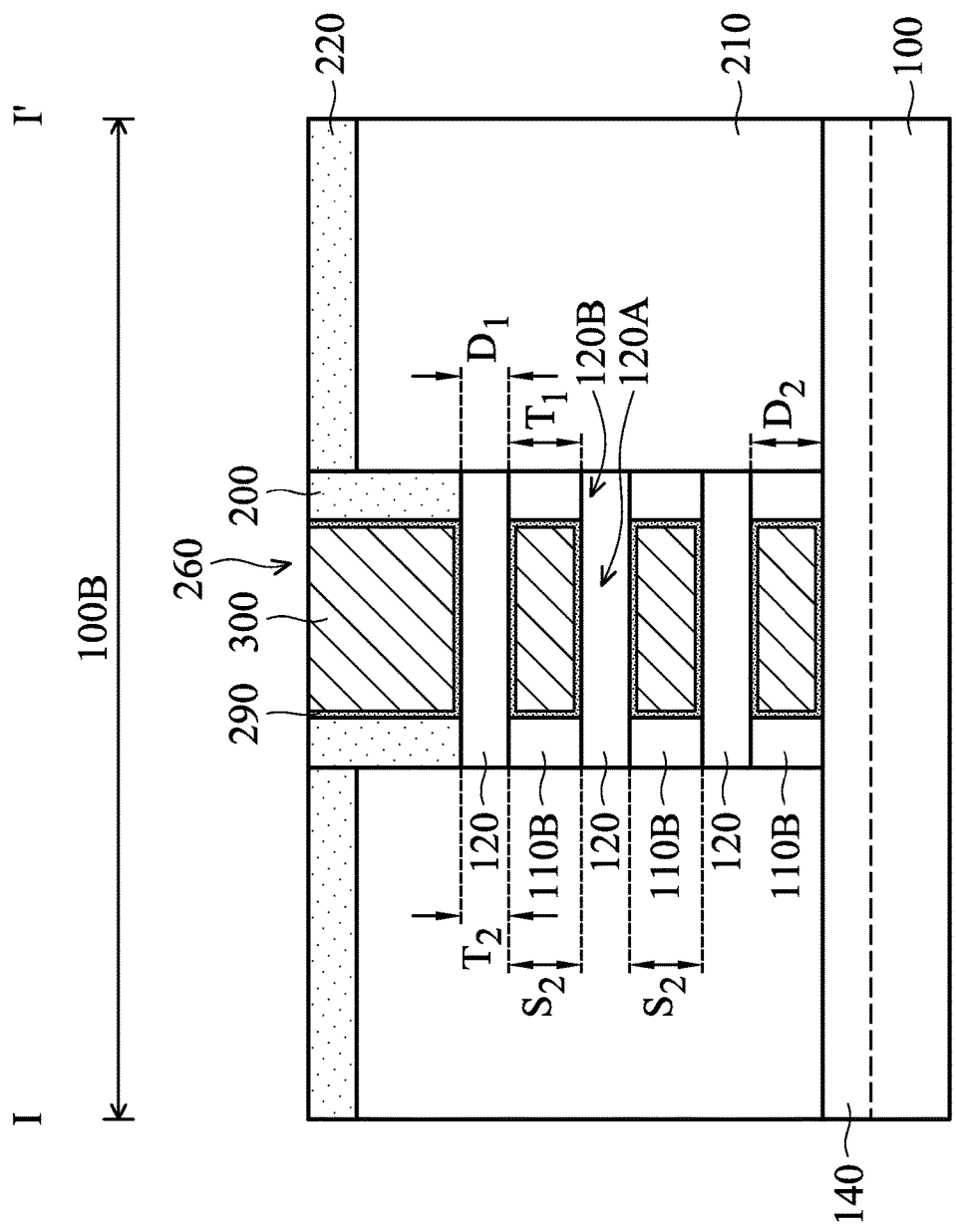

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include germanium tin, silicon germanium tin, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

As shown in FIG. 1A, multiple semiconductor layers 110 and 120 are alternately deposited over the semiconductor substrate 100, in accordance with some embodiments. Therefore, the semiconductor layers 110 and 120 are vertically stacked and positioned at different levels.

In some embodiments, each of the semiconductor layers 110 is thicker than each of the semiconductor layers 120. In some other embodiments, each of the semiconductor layers 110 is thinner than each of the semiconductor layers 120. In some embodiments, the thickness $T_1$ of each of the semiconductor layers 110 is in a range from about 0.5 nm to about 30 nm. In some other embodiments, the thickness $T_1$ is in a range from about 5 nm to about 15 nm. In some embodiments, the thickness $T_2$ of each of the semiconductor layers 120 is in a range from about 0.5 nm to about 30 nm. In some other embodiments, the thickness $T_2$ is in a range from about 5 nm to about 15 nm. In some embodiments, the difference between the thicknesses $T_1$ and $T_2$ is in a range from about 0.5 nm to about 30 nm. In some other embodiments, the difference between the thicknesses $T_1$ and $T_2$ is in a range from about 1 nm to about 10 nm. In some embodiments, a ratio of the thicknesses $T_1$ to the thicknesses $T_2$ is in a range from about 1.05 to about 4.

Embodiments of the disclosure are not limited thereto. In some other embodiments, only one semiconductor layer 110 and one semiconductor layer 120 are vertically stacked over the semiconductor substrate 100. In some embodiments, the thickness $T_1$ is in a range from about 2 nm to about 80 nm. In some other embodiments, the thickness $T_1$ is in a range from about 20 nm to about 50 nm. In some embodiments, the thickness $T_2$ is in a range from about 2 nm to about 80 nm. In some other embodiments, the thickness $T_2$ is in a range from about 20 nm to about 50 nm. In some embodiments, the difference between the thicknesses $T_1$ and $T_2$ is in a range from about 1 nm to about 70 nm. In some other embodiments, the difference between the thicknesses $T_1$ and $T_2$ is in a range from about 20 nm to about 50 nm. In some embodiments, a ratio of the thicknesses $T_1$ to the thicknesses $T_2$ is in a range from about 2 to about 15.

In some embodiments, the semiconductor layers 110 and 120 include silicon, silicon germanium, germanium tin, silicon germanium tin, or another suitable semiconductor material. In some embodiments, the semiconductor layers 110 are made of a different material than that of the semiconductor layers 120. In some embodiments, the semiconductor layers 110 are made of silicon germanium, and the semiconductor layers 120 are made of silicon.

In some embodiments, the semiconductor layers 110 and 120 are formed using an epitaxial growth process. Each of the semiconductor layers 110 and 120 may be formed using a selective epitaxial growth (SEG) process, a chemical vapor deposition (CVD) process (e.g., a vapor-phase epitaxy (VPE) process, a low pressure CVD (LPCVD) process, and/or an ultra-high vacuum CVD (UHV-CVD) process), a molecular beam epitaxy process, another applicable process, or a combination thereof. In some embodiments, the semiconductor layers 110 and 120 are grown in-situ in the same process chamber.

Figure 1B:
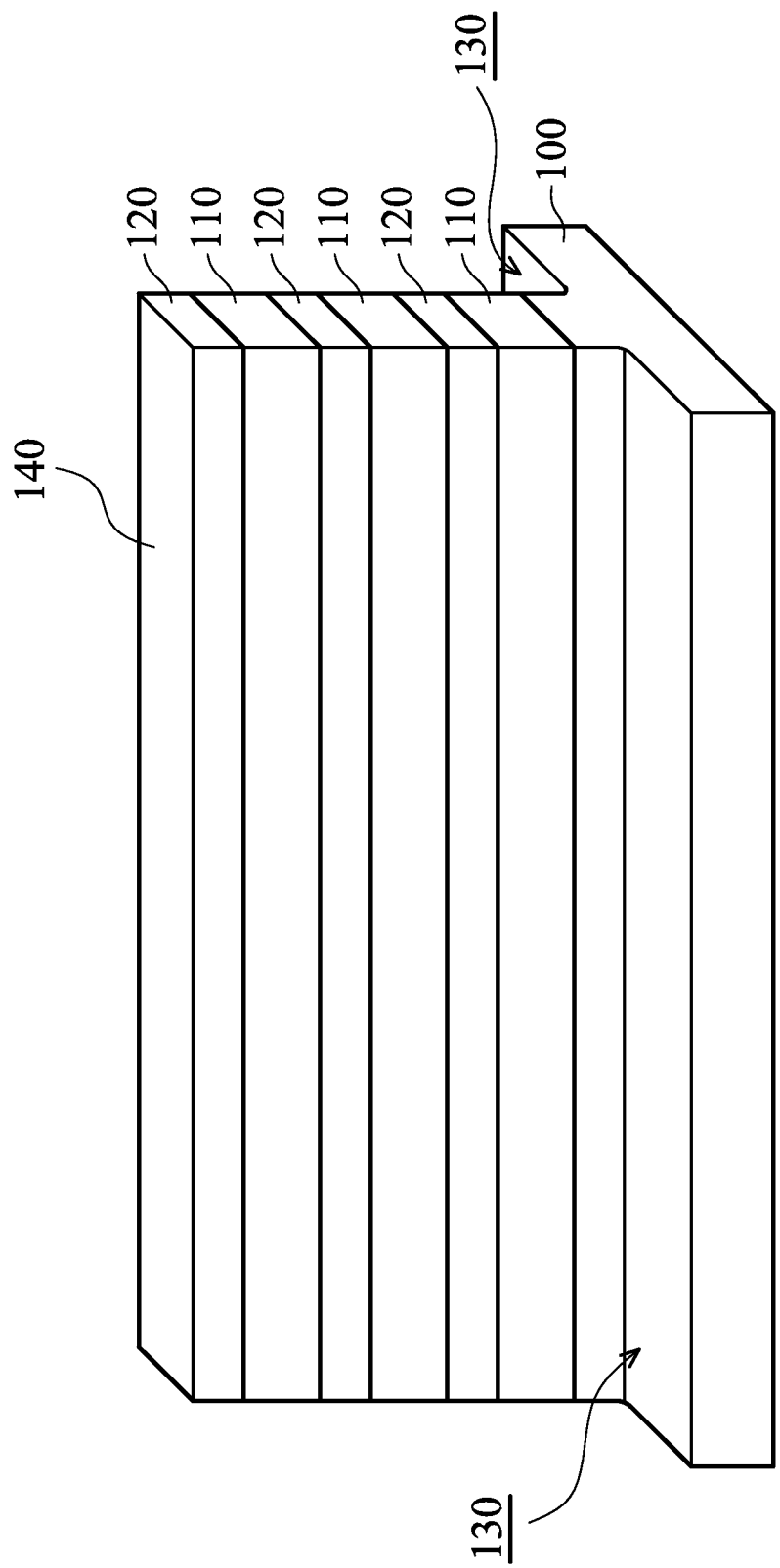

As shown in FIG. 1B, multiple recesses (or trenches) 130 are formed to pattern the semiconductor layers 110 and 120, in accordance with some embodiments. As a result, multiple fin structures 140 are formed between the recesses 130. As shown in FIG. 1B, one of the fin structures 140 is shown. The fin structures 140 include the semiconductor layers 110 and 120. In some other embodiments, the recesses 130 further extend into the semiconductor substrate 100. In these cases, the fin structures 140 further include a portion of the semiconductor substrate 100 between the recesses 130. In some embodiments, multiple photolithography processes and etching processes are performed to form the recesses 130. The recess 130 may be used to separate two neighboring field effect transistors (FETs).

In some embodiments, a hard mask (not shown) is formed over the topmost of the semiconductor layers 120 to assist in the formation of the recesses 130. In some embodiments, the hard mask includes a dielectric material, a metal material, another suitable material, or a combination thereof. In some embodiments, the hard mask is made of silicon nitride, silicon oxide, silicon carbide, silicon oxynitride, titanium nitride, titanium, another suitable material, or a combination thereof. In some embodiments, the hard mask is deposited using a CVD process, a physical vapor deposition (PVD) process, a spin-on process, an electroplating process, another applicable process, or a combination thereof.

Figure 1C:
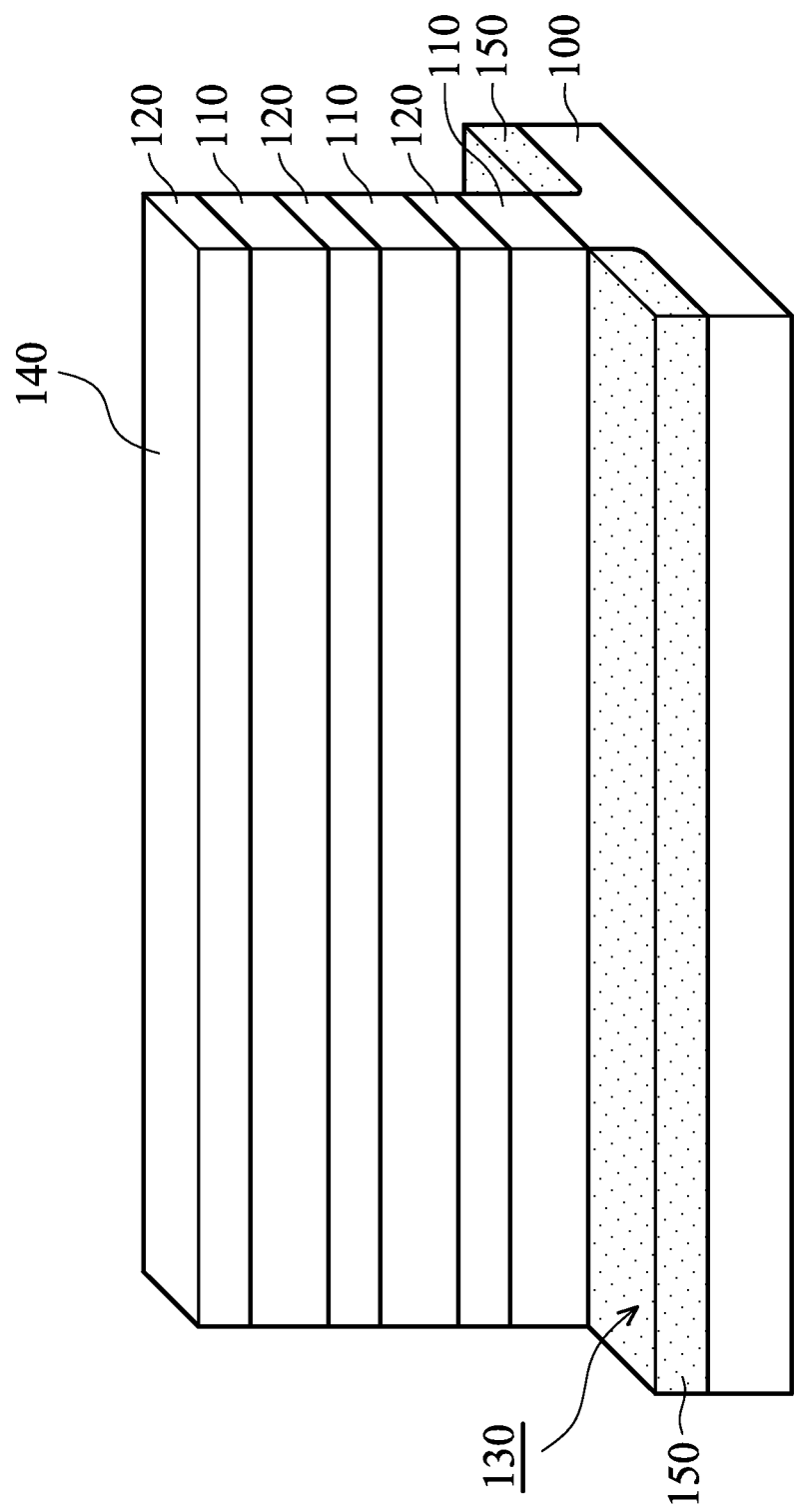

As shown in FIG. 1C, isolation features 150 are formed in the recesses 130, in accordance with some embodiments. The isolation features 150 are used to define and electrically isolate various device elements formed in and/or over the semiconductor substrate 100. In some embodiments, the isolation features 150 include shallow trench isolation (STI) features, local oxidation of silicon (LOCOS) features, another suitable isolation feature, or a combination thereof.

As shown in FIG. 1C, the fin structures 140 protrude from the isolation features 150, in accordance with some embodiments. The isolation features 150 surround the lower portion of the fin structures 140 (such as the upper portion of the semiconductor substrate 100). In some embodiments, the semiconductor layers 110 and 120 are not surrounded or covered by the isolation features 150.

In some embodiments, the top surface of the isolation features 150 is coplanar with the top surface of the upper portion of the semiconductor substrate 100, as shown in FIG. 1C. In some other embodiments, the top surface of the isolation features 150 is lower than the top surface of the upper portion of the semiconductor substrate 100. In other words, the upper portion of the semiconductor substrate 100 is partially exposed from the isolation features 150.

In some embodiments, each of the isolation features 150 has a multi-layer structure. In some embodiments, the isolation features 150 are made of a dielectric material. The dielectric material may include silicon oxide, silicon nitride, silicon oxynitride, spin-on glass, low-K dielectric material, other suitable materials, or a combination thereof.

In some embodiments, a dielectric material layer is deposited over the semiconductor substrate 100. The dielectric material layer covers the fin structures 140 and fills the recesses 130. In some embodiments, the dielectric material layer is deposited using a CVD process, a spin-on process, another applicable process, or a combination thereof. In some embodiments, a planarization process is subsequently performed to thin down the dielectric material layer until the fin structures 140 (such as the topmost of the semiconductor layers 120) are exposed. The planarization process may include a chemical mechanical polishing (CMP) process, a grinding process, an etching process, another applicable process, or a combination thereof. Afterwards, the dielectric material layer is etched back to form the isolation features 150.

Figure 1D:
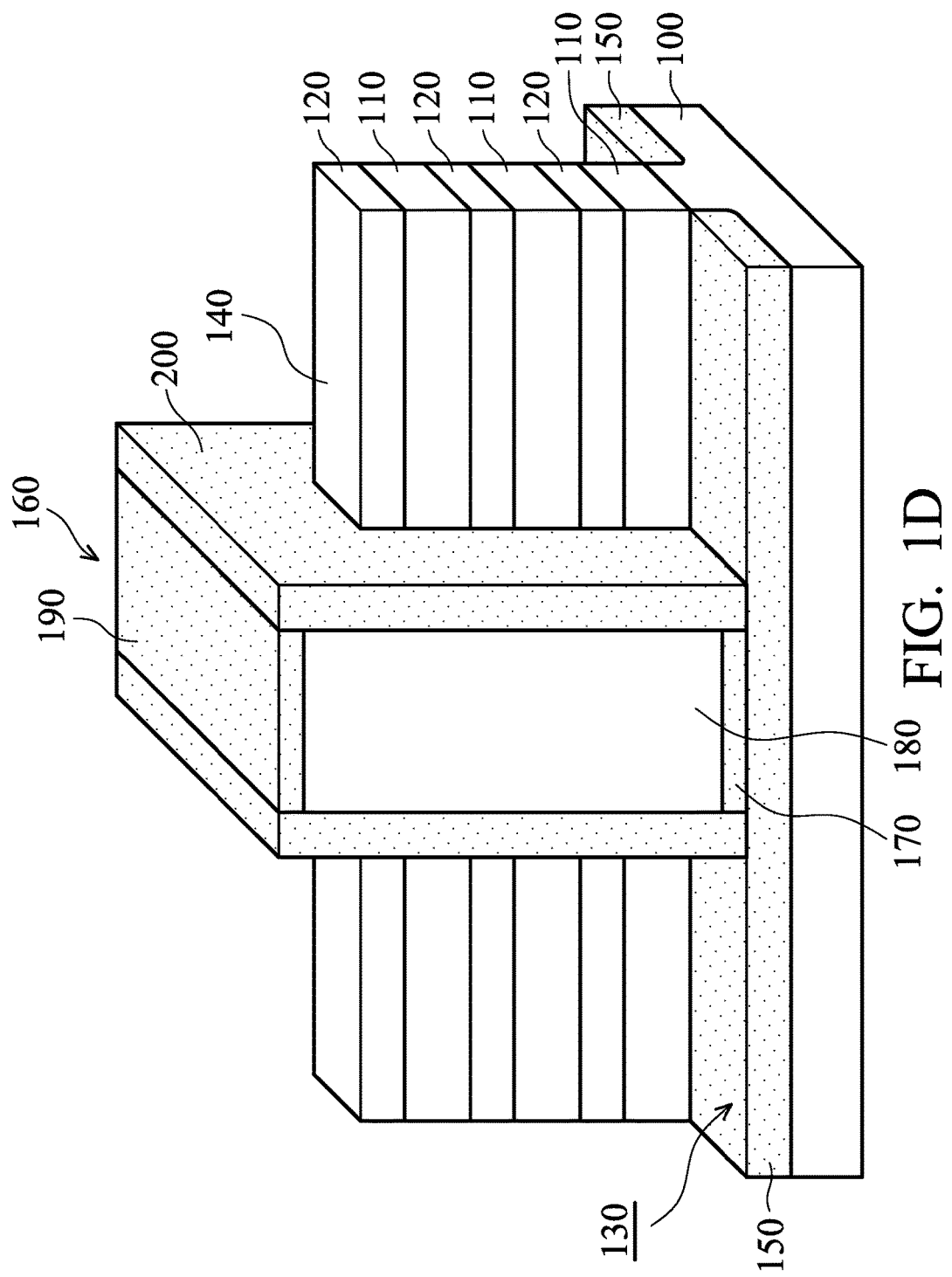

Afterwards, multiple dummy gate stacks 160 are formed over the semiconductor substrate 100, in accordance with some embodiments. As shown in FIG. 1D, one of the dummy gate stacks 160 is shown. The dummy gate stacks 160 cover portions of the fin structures 140 and the isolation features 150. The portions of the semiconductor layers 110 or the semiconductor layers 120 that are surrounded by the dummy gate stacks 160 may serve as fin channel structures. The fin channel structures are used as channel regions of FETs. In some embodiments, each of the dummy gate stacks 160 includes a dummy dielectric layer 170, a dummy gate electrode 180, and a hard mask 190.

The dummy dielectric layer 170 is deposited over the top portions and the sidewalls of the fin structures 140, in accordance with some embodiments. The dummy dielectric layer 170 may serve as an etch stop layer during subsequent etching processes. In some embodiments, the dummy dielectric layer 170 is made of a dielectric material. For example, the dummy dielectric layer 170 is made of silicon oxide. In some embodiments, the dummy dielectric layer 170 is conformally deposited over the fin structures 140. The dummy dielectric layer 170 may be deposited using a CVD process, an atomic layer deposition (ALD) process, a PVD process, a spin-on process, another applicable process, or a combination thereof.

In some embodiments, the dummy gate electrode 180 is made of polysilicon. The dummy gate electrode 180 will be replaced with another conductive material (such as a metal material). The hard mask 190 may be used to assist in the patterning process for forming the dummy gate stacks 160. In some embodiments, the hard mask 190 is made of silicon oxide, silicon nitride, silicon oxynitride, silicon carbide, another suitable material, or a combination thereof. In some embodiments, the hard mask 190 has a multi-layer structure. Many variations and modifications can be made to embodiments of the disclosure. In some other embodiments, the hard mask 190 is not formed.

In some embodiments, a dummy gate electrode layer and one or more hard mask layers are deposited over the dummy dielectric layer 170. In some embodiments, the dummy gate electrode layer and the hard mask layer are sequentially deposited by using suitable deposition methods. The suitable deposition methods may include a chemical vapor deposition process, an atomic layer deposition process, a thermal oxidation process, a physical vapor deposition process, another applicable process, or a combination thereof. Afterwards, a photolithography process and an etching process are performed to pattern the hard mask layer so as to form the hard mask 190.

With the assistance of the hard mask 190, the dummy gate electrode layer is patterned. As a result, the dummy gate electrode 180 is formed. During the etching process for forming the dummy gate electrode 180, the dummy dielectric layer 170 may serve as an etch stop layer to protect the fin structures 140 under the dummy dielectric layer 170. Afterwards, the portions of the dummy dielectric layer 170 that are not covered by the dummy gate electrode 180 are removed using, for example, another etching process. As a result, the dielectric layer 170 is patterned, and the dummy gate stacks 160 are formed, as shown in FIG. 1D.

As shown in FIG. 1D, spacer elements 200 are formed over sidewalls of the dummy gate stacks 160, in accordance with some embodiments. The spacer elements 200 may be used to assist in the formation of source or drain structures (or regions) in subsequent processes. In some embodiments, the spacer elements 200 partially cover the top portions and the sidewalls of the fin structures 140.

In some embodiments, the spacer elements 200 are made of a dielectric material. The dielectric material may include silicon carbon nitride, silicon nitride, silicon oxynitride, silicon carbide, another suitable dielectric material, or a combination thereof. In some embodiments, a spacer layer is deposited over the semiconductor substrate 100. In some embodiments, the spacer layer is conformally deposited. The spacer layer may be deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the dummy gate stacks 160 form the spacer elements 200.

Figure 1E:
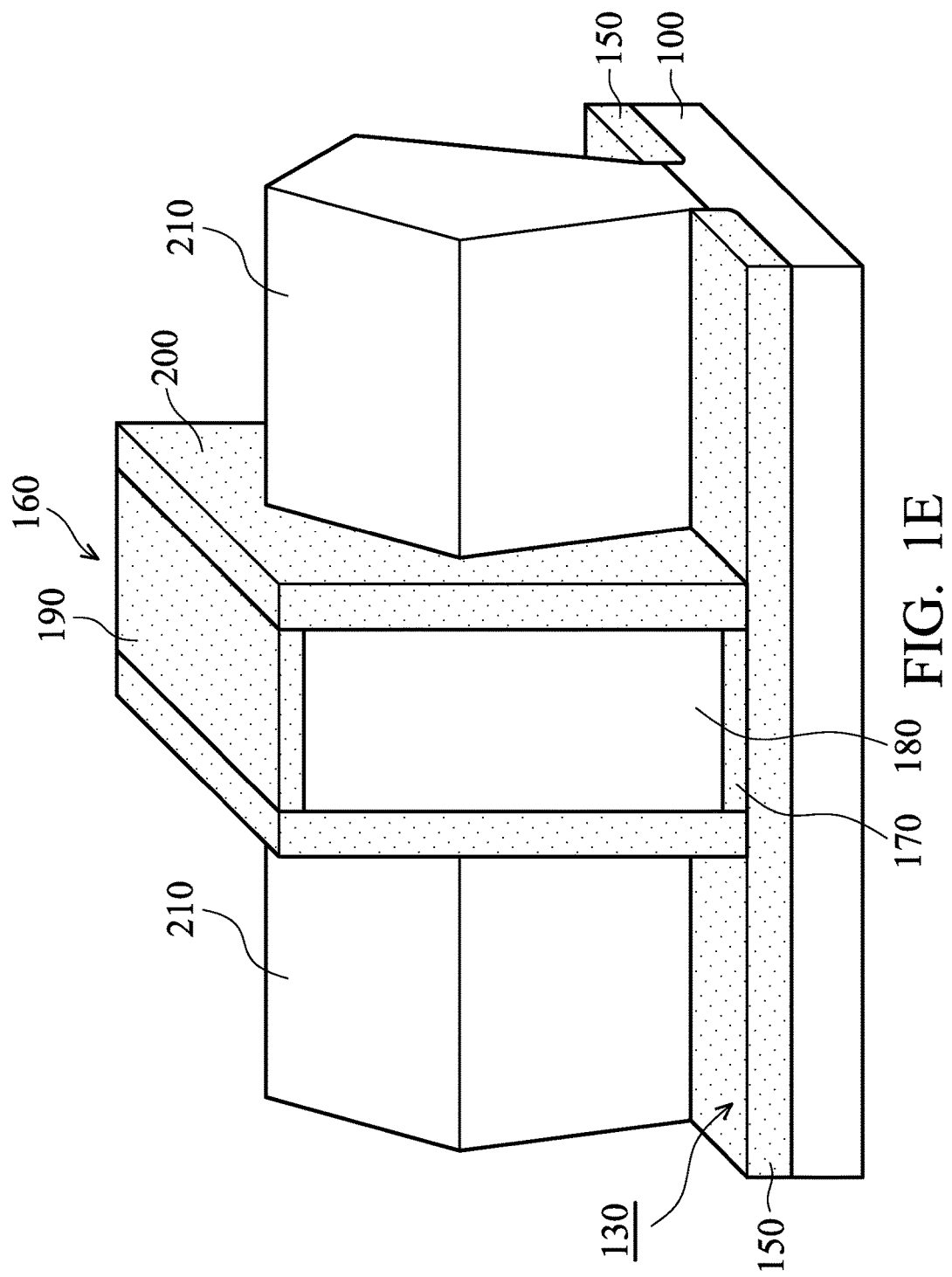

As shown in FIG. 1E, the portions of the semiconductor layers 110 and 120 that are not under the dummy gate stacks 160 and the spacer elements 200 are removed, in accordance with some embodiments. In some embodiments, an etching process is used to partially remove the semiconductor layers 110 and 120. As a result, space is created for a subsequent formation process of source or drain structures.

As shown in FIG. 1E, source or drain structures 210 are formed over the semiconductor substrate 100, in accordance with some embodiments. The source or drain structures 210 may also be used to provide stress or strain to channel regions below the dummy gate stacks 160. As a result, the carrier mobility of the device and device performance are improved.

In some embodiments, each of the source or drain structures 210 is in direct contact with one or more of the semiconductor layers 110 and 120. In some other embodiments, the source or drain structures 210 are separated from the semiconductor layers 110 and 120 by a liner layer. The liner layer may serve as an etch stop layer during subsequent etching processes to protect the source or drain structures 210.

In some embodiments, a semiconductor material (or two or more semiconductor materials) is epitaxially grown over the semiconductor substrate 100 so as to form the source or drain structures 210. In some embodiments, the growth of the source or drain structures 210 is performed simultaneously. In some embodiments, the growth of some of the source or drain structures 210 is performed separately in different processes.

In some embodiments, the source or drain structures 210 are a P-type semiconductor material. In some embodiments, the source or drain structures 210 are an N-type semiconductor material. The source or drain structures 210 may include epitaxially grown silicon, silicon-germanium (SiGe), epitaxially grown phosphorous-doped silicon (SiP), boron-doped silicon germanium (SiGeB) or another suitable epitaxially grown semiconductor material.

In some embodiments, the source or drain structures 210 are formed using a SEG process, a CVD process (e.g., a VPE process, a LPCVD process, and/or an UHV-CVD process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the source or drain structures 210 may use gaseous and/or liquid precursors. In some embodiments, the source or drain structures 210 are grown in-situ in the same process chamber. In other words, the source or drain structures 210 are formed using an in-situ epitaxial growth process. In some other embodiments, some of the source or drain structures 210 are grown separately.

In some embodiments, the source or drain structures 210 are doped with one or more suitable dopants. For example, the source or drain structures 210 are Si source or drain features doped with phosphorus (P), arsenic (As), antimony (Sb), or another suitable dopant. Alternatively, the source or drain structures 210 are SiGe source or drain features doped with boron (B) or another suitable dopant. In some embodiments, multiple implantation processes are performed to dope the source or drain structures 210.

In some embodiments, the source or drain structures 210 are doped in-situ during the growth of the source or drain structures 210. In some other embodiments, the source or drain structures 210 are not doped during the growth of the source or drain structures 210. After the epitaxial growth, the source or drain structures 210 are doped in a subsequent process. In some embodiments, the doping is achieved using an ion implantation process, a plasma immersion ion implantation process, a gas and/or solid source diffusion process, another applicable process, or a combination thereof. In some embodiments, the source or drain structures 210 are further exposed to annealing processes to activate the dopants. For example, a rapid thermal annealing process is performed.

Figure 1F:
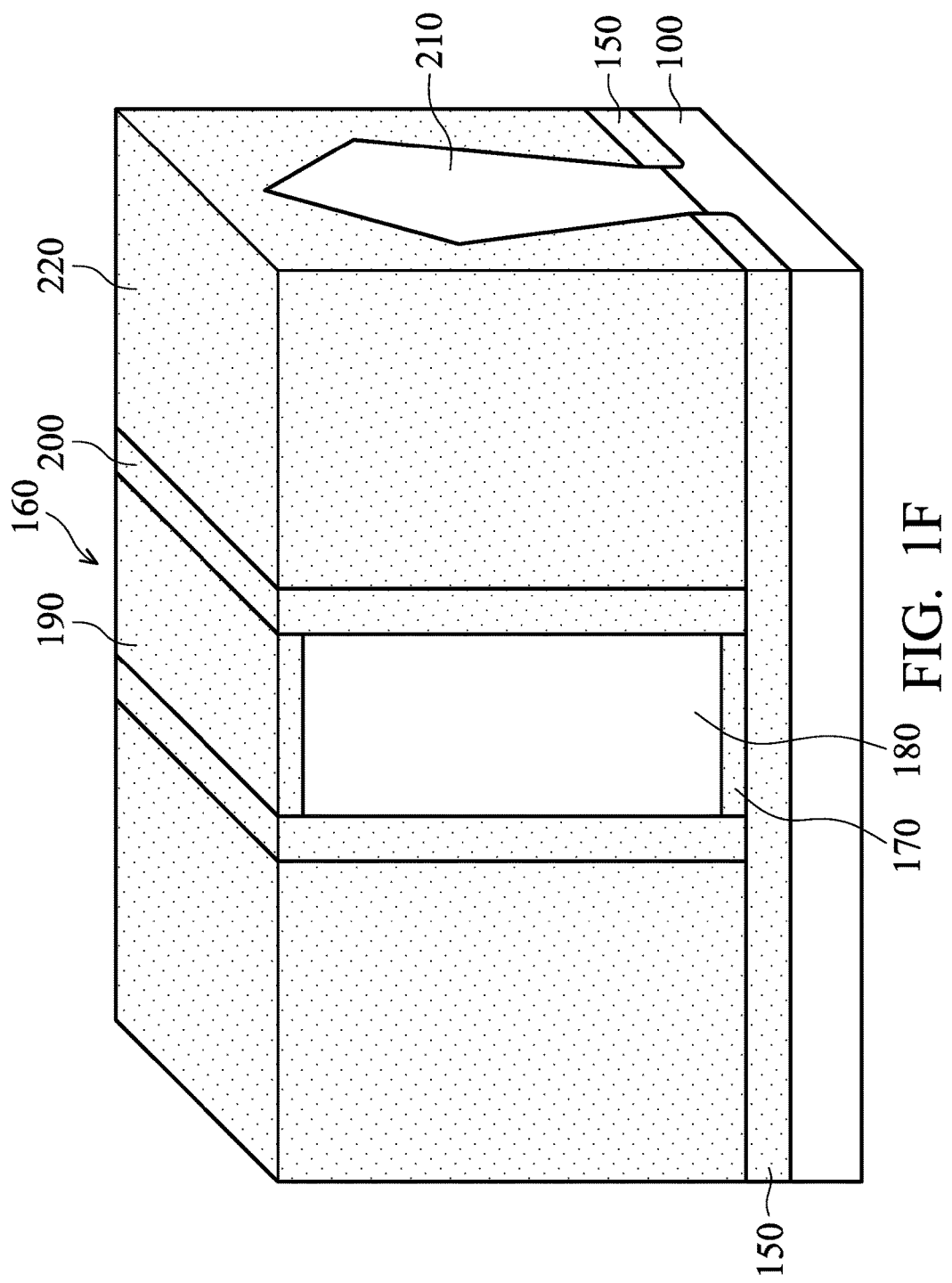

As shown in FIG. 1F, a dielectric layer 220 is deposited over the semiconductor substrate 100, in accordance with some embodiments. The dielectric layer 220 serves as an interlayer dielectric layer. In some embodiments, the dielectric layer 220 is made of silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof.

In some embodiments, the dielectric layer 220 is deposited using a CVD process, a spin-on process, an ALD process, a PVD process, another applicable process, or a combination thereof. In some embodiments, the dielectric layer 220 covers the isolation features 150, the dummy gate stacks 160, the spacer elements 200, and the source or drain structures 210. Afterwards, the dielectric layer 220 is thinned down until the dummy gate stacks 160 and the spacer elements 200 are exposed. In some embodiments, a planarization process is performed to thin down the dielectric layer 220. The planarization process may include a CMP process, a grinding process, an etching process, another applicable process, or a combination thereof.

In accordance with some embodiments, the semiconductor device structure is divided into multiple regions 100A and 100B. In some embodiments, N-type FETs or P-type FETs are configured to form in the regions 100A and 100B. In some embodiments, one or more N-type FETs are configured to form in the regions 100A and one or more P-type FETs are configured to form in the regions 100B. In some embodiments, one or more P-type FETs are configured to form in the regions 100A and one or more N-type FETs are configured to form in the regions 100B.

Afterwards, a first mask layer (not shown) is formed over the dielectric layer 220 in the regions 100A and 100B to assist in the subsequent etching processes. In some embodiments, the first mask layer covers the regions 100A and 100B without covering the dummy gate stacks 160 in the regions 100A. In some embodiments, the first mask layer is a patterned photoresist layer. The patterned photoresist layer is formed using a photolithography process. The photolithography process may include photoresist coating (e.g., spin-on coating), soft baking, mask aligning, exposure, post-exposure baking, developing the photoresist, rinsing, drying (e.g., hard baking), another suitable process, or a combination thereof.

Figure 1G:
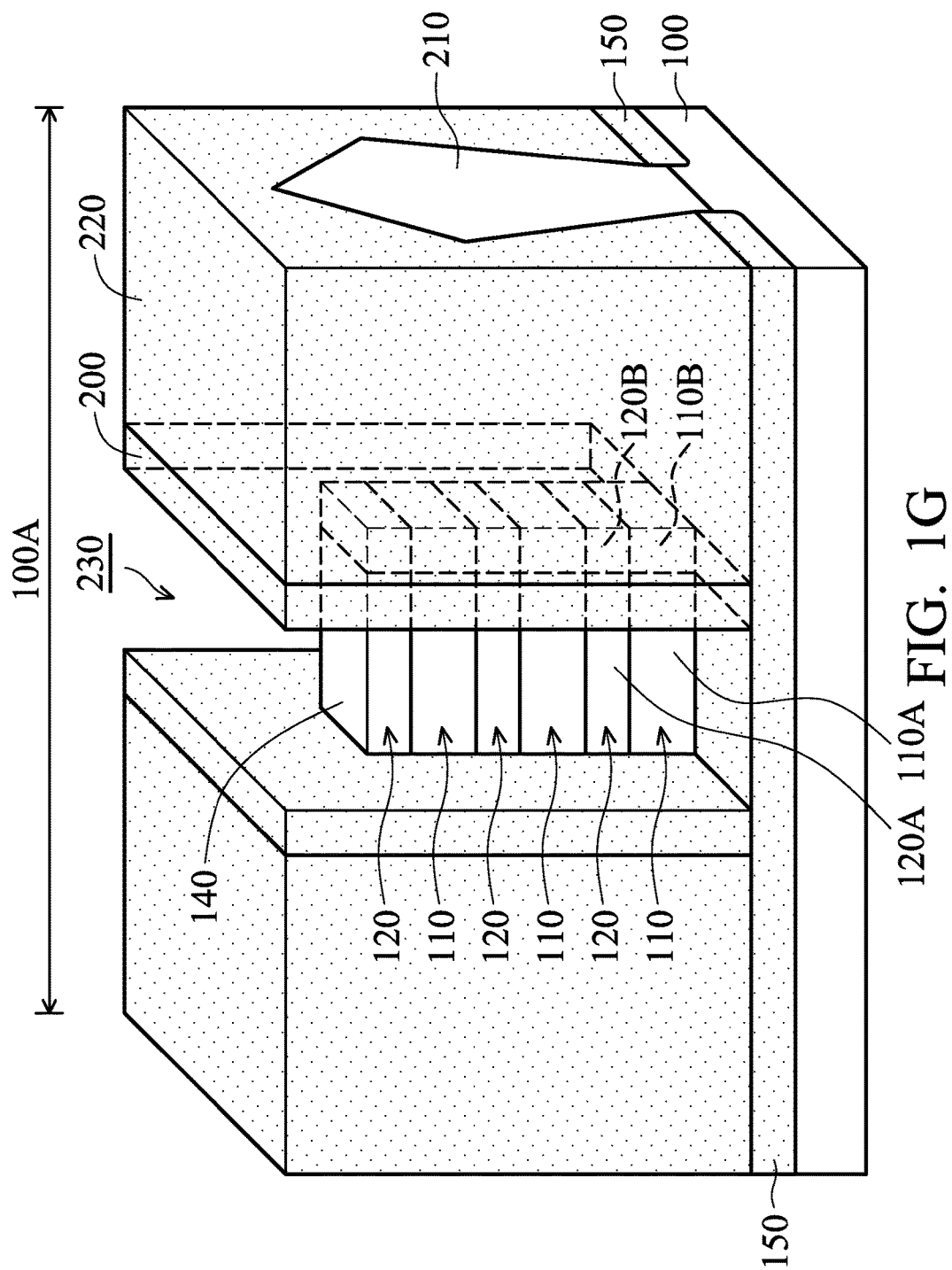

As shown in FIG. 1G, the dummy gate stacks 160 in the regions 100A are removed, in accordance with some embodiments. As a result, recesses 230 are formed over the semiconductor substrate 100 in the regions 100A. In some embodiments, the dummy gate stacks 160 are removed using a wet etching process, a dry etching process, another applicable process, or a combination thereof.

In some embodiments, first portions 110A of the semiconductor layers 110 are exposed from the recesses 230, and second portions 110B of the semiconductor layers 110 are covered by the spacer elements 200. In some embodiments, first portions 120A of the semiconductor layers 120 are exposed from the recesses 230, and second portions 120B of the semiconductor layers 120 are covered by the spacer elements 200. The second portions 110B and 120B are illustrated as dashed lines so that the second portions 110B and 120B covered by the spacer elements 200 are still visible in FIG. 1G for a better understanding of the structure.

Figure 1H:
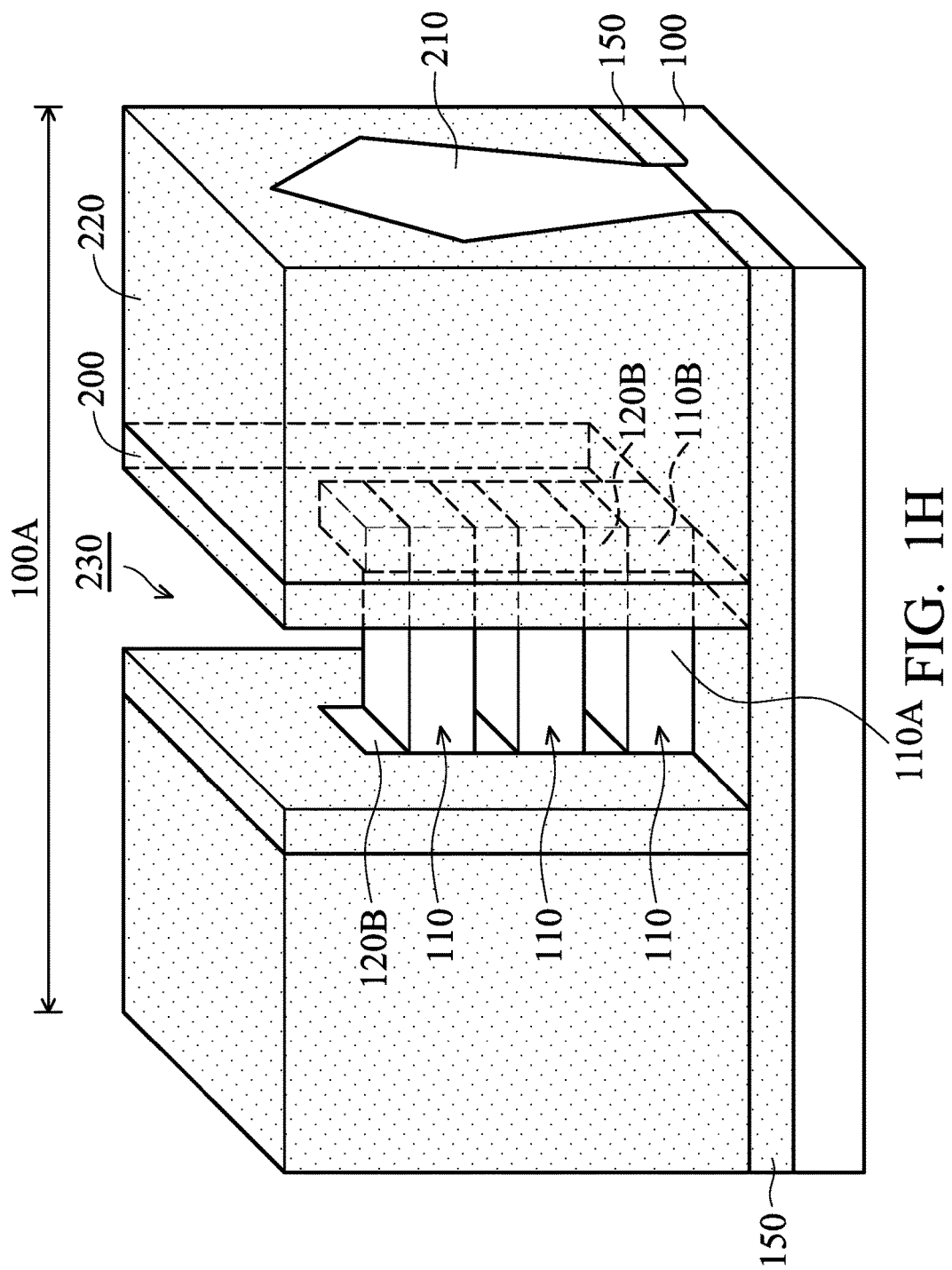

As shown in FIG. 1H, the first portions 120A of the semiconductor layers 120 are removed, in accordance with some embodiments. As a result, the semiconductor layers 110 suspend between the source or drain structures 210. The semiconductor layers 110 are nanowires and serve as channel regions of FETs in the regions 100A. In some embodiments, the semiconductor layers 110 have a rectangular or square cross-sectional profile.

In some embodiments, the first portions 120A are substantially removed without residue. In some other embodiments, one or more first portions 120A partially remain between the first portions 110A. In some embodiments, the second portions 120B remain below the spacer elements 200. In some other embodiments, the second portions 120B previously below the spacer elements 200 are partially removed. In some other embodiments, the second portions 120B are completely removed. In some embodiments, each of the source or drain structures 210 is in direct contact with the second portions 110B and 120B. In some other embodiments, the source or drain structures 210 are separated from the second portions 110B and 120B.

The first portions 110A are separated from one another by a spacing $S_1$, as shown in FIG. 2A in accordance with some embodiments. In some embodiments, the spacing $S_1$ is substantially the same as the thicknesses $T_2$ of the second portions 120B of the semiconductor layers 120. In some embodiments, the spacing $S_1$ is different from the thicknesses $T_1$ of the first portions 110A and the second portions 110B. In some embodiments, the spacing $S_1$ is less than the thicknesses $T_1$. In some other embodiments, the spacing $S_1$ is greater than the thicknesses $T_1$.

In some embodiments, the distance $D_1$ between the spacer elements 200 and the second portions 110B of the topmost of the semiconductor layers 110 is different from the thicknesses $T_1$. In some embodiments, the distance $D_1$ is less than the thicknesses $T_1$. In some other embodiments, the distance $D_1$ is greater than the thicknesses $T_1$.

In some embodiments, the distance $D_2$ between the upper portions of the semiconductor substrate 100 and the second portions 120B of the bottommost of the semiconductor layers 120 is different from the thicknesses $T_2$. In some embodiments, the distance $D_2$ is greater than the thicknesses $T_2$. In some other embodiments, the distance $D_2$ is less than the thicknesses $T_2$. In some embodiments, the distance $D_2$ is greater than the distance $D_1$. In some other embodiments, the distance $D_2$ is less than the distance $D_1$.

In some embodiments, an etching process is performed to selectively remove the semiconductor layers 120 without removing the semiconductor layers 110. In some embodiments, the etching process includes a wet etching process, a dry etching process, or another suitable etching process. In some embodiments, the etchant used in the etching process includes a liquid mixture. The liquid mixture may include $NH_4OH$, ammonia-peroxide mixture (APM), tetramethyl ammonium hydroxide (TMAH), another suitable solution, or a combination thereof. In some other embodiments, the etchant used in the etching process includes a gas mixture. The gas mixture may include $CF_4$, $SF_6$, $CH_3F$, another suitable gas, or a combination thereof. During the etching operations, the composition of the etchant may be varied according to requirements.

In some embodiments, a liner layer is sandwiched between the source or drain structures 210 and the semiconductor layers 110 and 120. The liner layer may serve as an etch stop layer to protect the source or drain structures 210.

In some embodiments, the semiconductor layers 120 are etched from their side surfaces exposed from the recesses 230. In some embodiments, the etchant has a sufficiently high etch selectivity of the semiconductor layers 120 to the semiconductor layers 110. As a result, the semiconductor layers 120 are etched faster than the semiconductor layers 110. In some embodiments, a ratio of the etching rate of the semiconductor layers 120 to the etching rate of the semiconductor layers 110 is in a range from about 1.6 to about 58. Accordingly, it is easier to cleanly remove the semiconductor layers 120 without residue and without damaging the semiconductor layers 110.

Afterwards, a thermal treatment is performed over the structure shown in FIG. 1H, in accordance with some embodiments. The thermal treatment may be an annealing process. In some embodiments, the surfaces of the semiconductor layers 110 are oxidized during the thermal treatment. Afterwards, the oxidized portions of the surfaces of the semiconductor layers 110 are removed using an etching process. As a result, the semiconductor layers 110 are shaped to have a curved surface or a relatively rounded cross-sectional profile, in accordance with some embodiments. In some other embodiments, the semiconductor layers 110 have a circular cross-sectional profile. The quality and reliability of the semiconductor layers 110 may be improved. During the thermal treatment, atoms in the semiconductor layers 110 may be rearranged. In some embodiments, the rearrangement of the atoms causes the corners of the semiconductor layers 110 to be rounded.

In some embodiments, the thermal treatment is performed at a temperature that is in a range from about 400 degrees C. to about 500 degrees C. In some embodiments, the thermal treatment is performed at a pressure that is in a range from about 20 atm to about 25 atm. In some embodiments, the thermal treatment is performed in a hydrogen-containing atmosphere or another suitable ambiance. Many variations and modifications can be made to embodiments of the disclosure. In some other embodiments, the thermal treatment is not performed.

In some embodiments, the semiconductor layers 110 shrink slightly after the removal of the first portions 120A. For example, the semiconductor layers 110 may become smaller due to the thermal treatment, or the use of an etching process. As a result, the spacing $S_1$ is broadened. Therefore, it is easier to enclose the nanowires with subsequently formed metal gate stack structures.

Figure 1I:
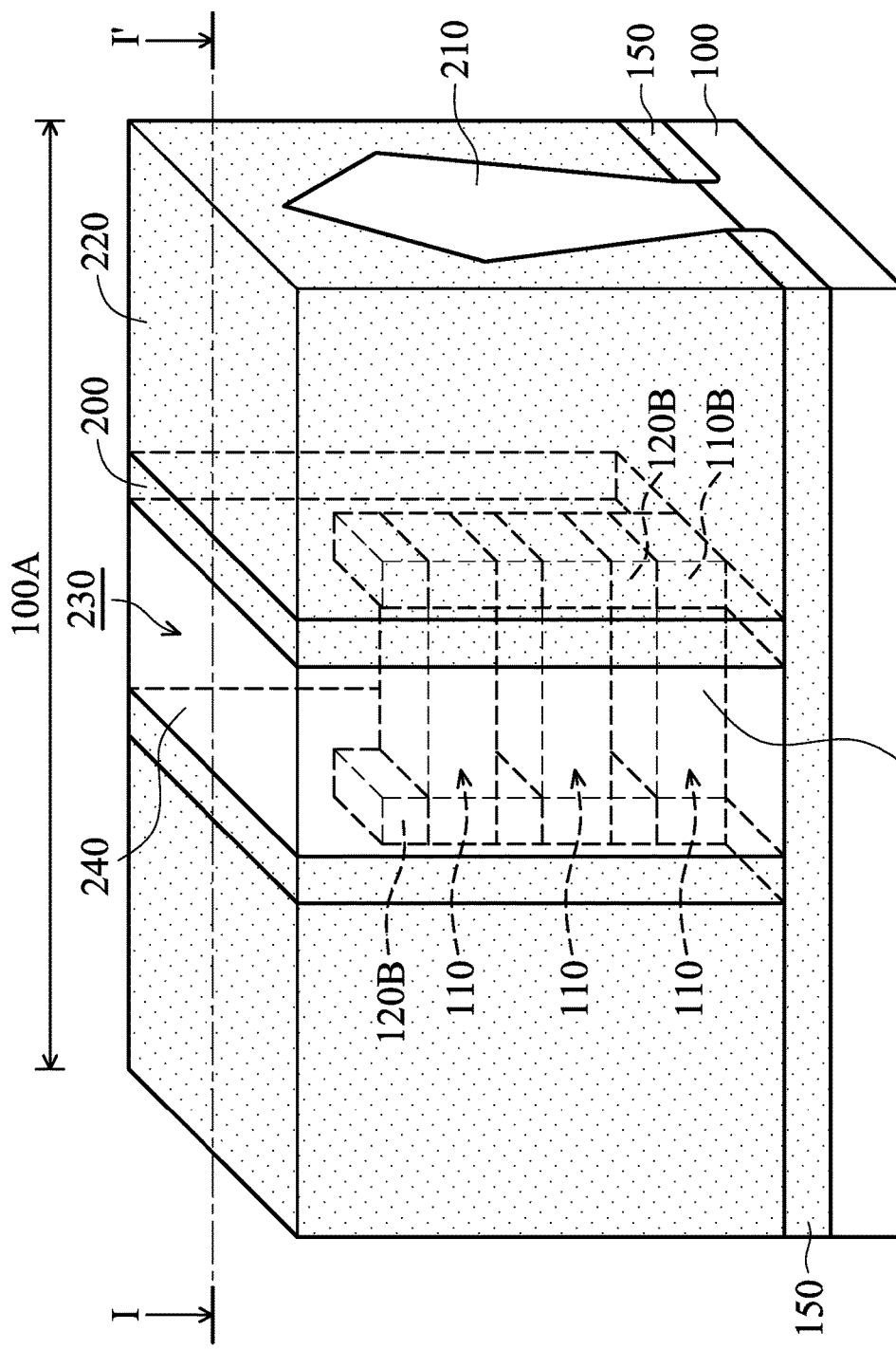

As shown in FIG. 1I, metal gate stack structures 240 are formed in the recesses 230 in the regions 100A, in accordance with some embodiments. For illustration purpose, the first portions 110A covered by the metal gate stack structures 240 are illustrated as dashed lines to be still visible in FIG. 1I.

In some embodiments, the metal gate stack structures 240 encircle the semiconductor layers 110. In some embodiments, the metal gate stack structures 240 surround four or more sides of each of the semiconductor layers 110. Embodiments of the disclosure are not limited thereto. In some other embodiments, only three sides of the semiconductor layers 110 are clad in the metal gate stack structures 240.

As shown in FIG. 2A, each of the metal gate stack structures 240 includes a gate dielectric layer 270 and a metal gate electrode 280. The gate dielectric layer 270 is sandwiched between the metal gate electrode 280 and the semiconductor layers 110. In some embodiments, the second portions 120B of the semiconductor layers 120 are separated from the metal gate electrode 280 by the gate dielectric layer 270.

In some embodiments, the gate dielectric layer 270 includes a high-k material layer. The high-K dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 270 is deposited using an ALD process, a CVD process, a spin-on process, another applicable process, or a combination thereof. In some embodiments, a high-temperature annealing operation is performed to reduce or eliminate defects in the gate dielectric layer 270.

In some embodiments, the gate dielectric layer 220 includes an interfacial layer (not shown) adjacent to the nanowires. The interfacial layer may be used to reduce stress between the high-k material layer and the nanowires. In some embodiments, the interfacial layer is made of silicon oxide. In some embodiments, the interfacial layer is formed using an ALD process, a thermal oxidation process, another applicable process, or a combination thereof. In some other embodiments, the gate dielectric layer 220 does not include the interfacial layer. In some embodiments, the gate dielectric layer 220 is in direct contact with the nanowires.

In some embodiments, the metal gate electrode 280 includes metal gate stacking layers. The metal gate stacking layers may include one or more work function layers and one or more metal filling layers. Some of these metal gate stacking layers can be replaced or eliminated for different embodiments. Additional layers (such as a barrier layer and a blocking layer) can be added into the metal gate electrode 280.

In some embodiments, the metal gate stacking layers include metal, metal carbide, metal nitride, other suitable materials, or a combination thereof. For example, the metal includes titanium, aluminum, tungsten, gold, platinum, cobalt, other suitable metals, or a combination thereof. In some embodiments, the metal gate stacking layers are deposited using an ALD process, a PVD process, a CVD process, an electroplating process, an electroless plating process, a CVD process, another applicable process, or a combination thereof.

The gate dielectric layer 270 and the metal gate stacking layers together fill the recesses 230. Afterwards, the portions of the gate dielectric layer 270 and the metal gate stacking layers outside of the recesses 230 are removed. The metal gate stacking layers in one of the recesses 230 form the metal gate electrode 280. As a result, the gate dielectric layer 270 and the metal gate electrode 280 remaining in one of the recesses 230 together form the metal gate stack structures 240.

A planarization process is performed to partially remove the gate dielectric layer 270 and the metal gate stacking layers outside of the recesses 230. The planarization process may include a CMP process, a grinding process, an etching process, another applicable process, or a combination thereof. In some embodiments, the first mask layer is removed before the formation of the metal gate stack structures 240. The first mask layer may be removed during the planarization process.

Afterwards, a second mask layer (not shown) is formed over the dielectric layer 220 in the regions 100A and 100B to assist in the subsequent etching processes. In some embodiments, the second mask layer covers the regions 100A and 100B without covering the dummy gate stacks 160 in the regions 100B. In some embodiments, the second mask layer is a patterned photoresist layer.

Figure 1J:
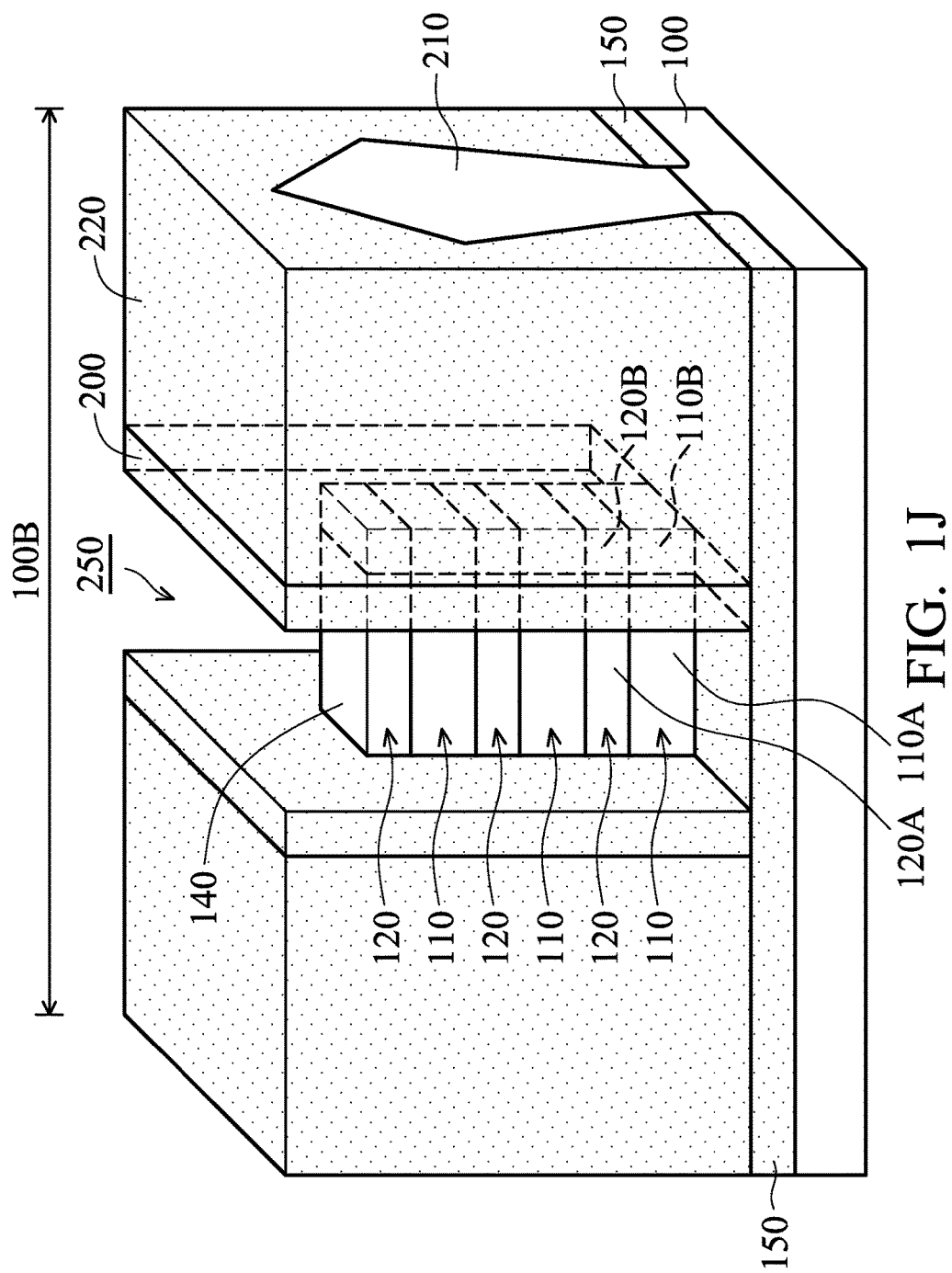

As shown in FIG. 1J, the dummy gate stacks 160 in the regions 100B are removed, in accordance with some embodiments. As a result, recesses 250 are formed in the regions 100B to expose the first portions 110A of the semiconductor layers 110 and the first portions 120A of the semiconductor layers 120. In some embodiments, the second portions 110B of the semiconductor layers 110 and the second portions 120B of the semiconductor layers 120 are not exposed from the recesses 250. In some embodiments, the recesses 250 are formed using a wet etching process, a dry etching process, another applicable process, or a combination thereof.

Figure 1K:
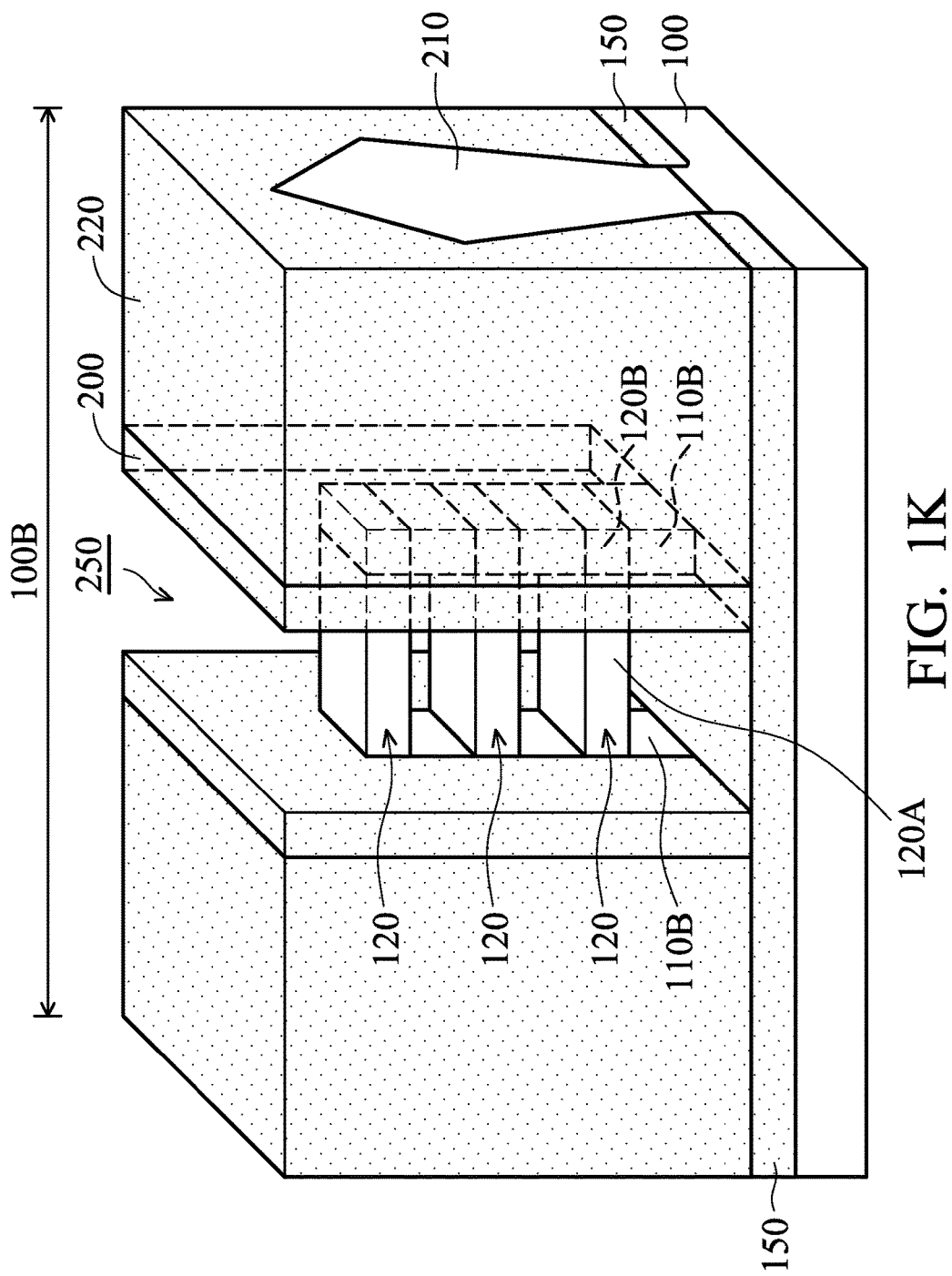

As shown in FIG. 1K, the first portions 110A of the semiconductor layers 110 are removed, in accordance with some embodiments. As a result, the semiconductor layers 120 suspend between the source or drain structures 210. The semiconductor layers 120 are nanowires and serve as channel regions of FETs in the regions 100B. In some embodiments, the semiconductor layers 120 have a rectangular or square cross-sectional profile.

In some embodiments, the first portions 110A are substantially removed without residue. In some other embodiments, one or more first portions 110A partially remain between the first portions 120A. In some embodiments, the second portions 110B remain below the spacer elements 200. In some other embodiments, the second portions 110B previously below the spacer elements 200 are partially removed. In some other embodiments, the second portions 120B are completely removed.

The first portions 120A are separated from one another by a spacing $S_2$, as shown in FIG. 2B in accordance with some embodiments. In some embodiments, the spacing $S_2$ is substantially the same as the thicknesses $T_1$ of the second portions 110B of the semiconductor layers 110. In some embodiments, the spacing $S_2$ is different from the thicknesses $T_2$ of the first portions 120A and the second portions 120B. In some embodiments, the spacing $S_2$ is greater than the thicknesses $T_2$. In some other embodiments, the spacing $S_2$ is less than the thicknesses $T_2$.

In some embodiments, an etching process is performed to selectively remove the semiconductor layers 110 without removing the semiconductor layers 120. In some embodiments, the etching process includes a wet etching process, a dry etching process, or another suitable etching process. In some embodiments, the etchant used in the etching process includes include $NH_4OH$, APM, TMAH, another suitable solution, or a combination thereof. In some other embodiments, the etchant used in the etching process includes $CF_4$, $SF_6$, $CH_3F$, another suitable gas, or a combination thereof.

In some cases, an etchant for removing silicon has a sufficiently high etch selectivity of silicon to silicon germanium while another etchant for removing silicon germanium does not have a sufficiently high etch selectivity of silicon germanium to silicon. For example, an etchant has an etch selectivity of silicon to silicon germanium in a range from about 20 to about 77, and another etchant has an etch selectivity of silicon germanium to silicon in a range from about 9 to about 12. In some cases, a ratio of the etch selectivity for removing silicon to the etch selectivity for removing silicon germanium is in a range from about 1.6 to about 8.6. As a result, it may be difficult to remove silicon germanium without residue and without damaging silicon.

In some embodiments, the etchant for removing the semiconductor layers 110 has an insufficiently high etch selectivity of the semiconductor layers 110 to the semiconductor layers 120. For example, the etch selectivity of the etchant for removing the semiconductor layers 110 is less than the etch selectivity of the etchant for removing the semiconductor layers 120.

In accordance with some embodiments, the semiconductor layers 110 are thicker than the semiconductor layers 120. As a result, the etchant for removing the semiconductor layers 110 contacts more surface areas of the semiconductor layers 110. Accordingly, it is easier for the etchant to diffuse into the semiconductor layers 110 from their side surfaces. The semiconductor layers 110 are more likely etched through and removed cleanly. In some embodiments, a ratio of the etching rate of the semiconductor layers 110 to the etching rate of the semiconductor layers 120 is in a range from about 2 to about 58.

In some embodiments, the ratio of the thicknesses $T_1$ to the thicknesses $T_2$ is controlled to be in a range from about 1.1 to about 2.5. In some cases, the ratio of the thicknesses $T_1$ to the thicknesses $T_2$ should be greater than about 1, such as greater than about 1.1. If the ratio of the thicknesses $T_1$ to the thicknesses $T_2$ is substantially the same as or less than about 1, it may be difficult to form good nanowires due to the loading effect of the selective etching processes. For example, there may be residue of the semiconductor layers 110 between the nanowires. Alternatively, the nanowires may be slightly etched and damaged. However, embodiments of the disclosure are not limited thereto. In some other cases, the ratio of the thicknesses $T_1$ to the thicknesses $T_2$ may be substantially the same as or less than about 1.

In some cases, the ratio of the thicknesses $T_1$ to the thicknesses $T_2$ should not be greater than about 2.5. If the ratio of the thicknesses $T_1$ to the thicknesses $T_2$ is greater than about 2.5, the quality and reliability of the nanowires may be negatively affected. For example, the nanowires may have defects if the semiconductor layers 110 are too thicker than the semiconductor layers 120. However, embodiments of the disclosure are not limited thereto. In some other cases, the ratio of the thicknesses $T_1$ to the thicknesses $T_2$ may be greater than about 2.5.

Similarly, a thermal treatment is performed over the structure shown in FIG. 1K, in accordance with some embodiments. In some embodiments, the corners of the semiconductor layers 120 are rounded. In some embodiments, the semiconductor layers 120 have a curved surface or a relatively rounded cross-sectional profile. In some other embodiments, the semiconductor layers 120 have a circular cross-sectional profile.

Figure 1L:
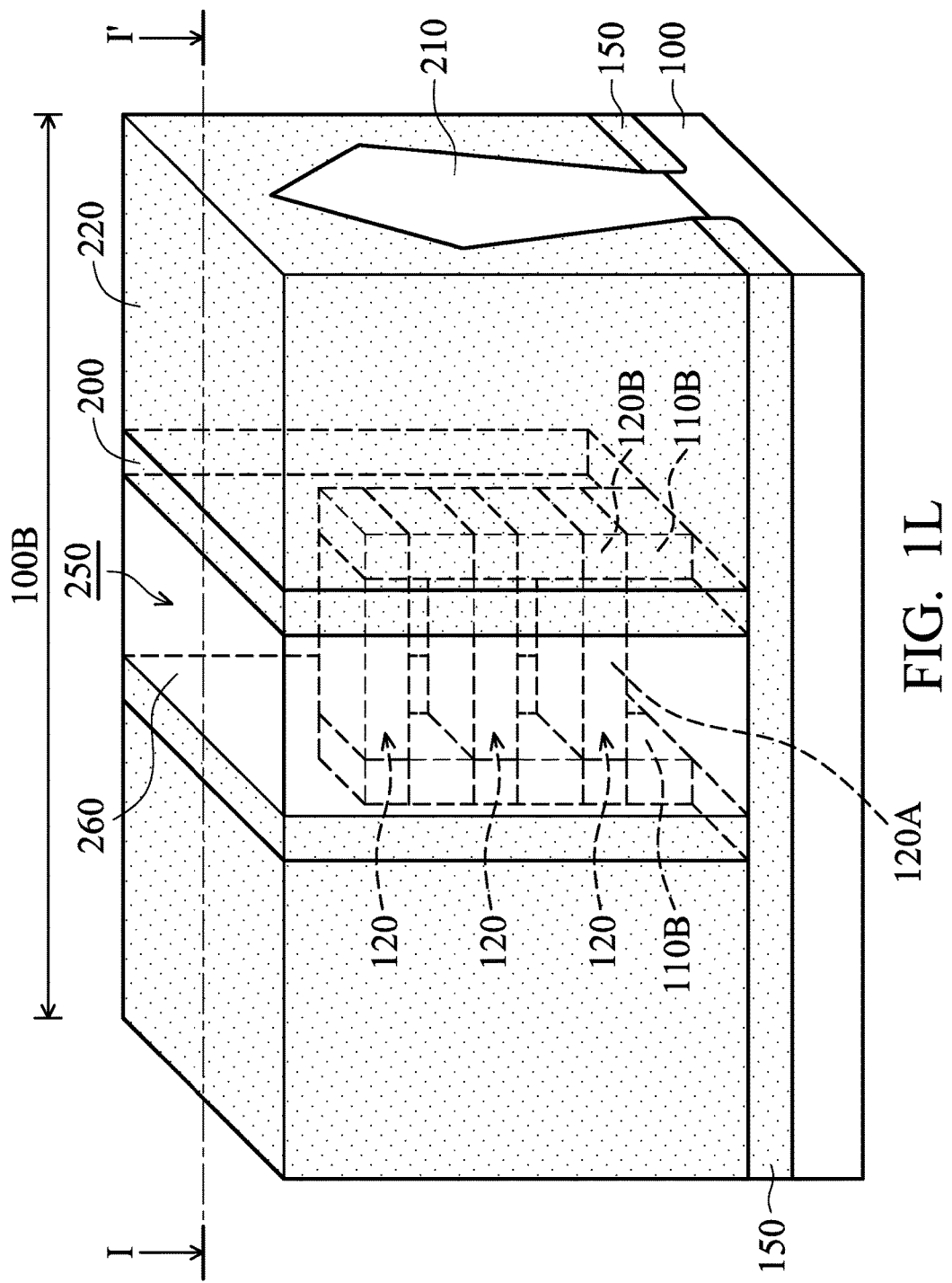

As shown in FIG. 1L, metal gate stack structures 260 are formed in the recesses 250 in the regions 100B, in accordance with some embodiments. The first portions 120A covered by the metal gate stack structures 260 are illustrated as dashed lines in FIG. 1L for a better understanding of the structure.

In some embodiments, the metal gate stack structures 260 wind around four or more sides of each of the semiconductor layers 120. In some other embodiments, the metal gate stack structures 260 only envelop three sides of the semiconductor layers 120.

As shown in FIG. 2B, each of the metal gate stack structures 260 includes a gate dielectric layer 290 and a metal gate electrode 300. The materials and/or formation methods of the metal gate stack structures 260 are the same as or similar to that of the metal gate stack structures 240 illustrated in the aforementioned embodiments and are not repeated. In some embodiments, the second mask layer is removed before the formation of the metal gate stack structures 260. The second mask layer may be removed during the planarization process for forming the metal gate stack structures 260.

Embodiments of the disclosure are not limited thereto. In some other embodiments, the second mask layer is not formed. The first mask layer may be further patterned to assist in the subsequent removal of the dummy gate stacks 160 in the regions 100B. In some embodiments, the planarization processes for forming the metal gate stack structures 240 and 260 are performed at different stages. In some other embodiments, the planarization process for forming the metal gate stack structures 240 and 260 are performed at the same stage. The first mask layer may be removed during the planarization process for forming the metal gate stack structures 240 and 260.

As shown in FIGS. 1I, 1L, 2A and 2B, the dimension of the first portions 110A is different from that of the first portions 120A, in accordance with some embodiments. The dimension includes thickness, diameter, circumference, or a combination thereof. In some other embodiments, the first portions 110A and 120A have substantially the same dimension. For example, the dimension of the first portions 110A and/or 120A can change during operation. As a result, the first portions 110A and 120A may be the same thickness.

In some embodiments, the spacing $S_2$ is greater than the spacing $S_1$, as shown in FIGS. 2A and 2B. In some other embodiments, the spacing $S_2$ is substantially the same as or less than the spacing $S_1$. In some embodiments, the portions of the metal gate stack structures 260 between the semiconductor layers 120 are thicker than the portions of the metal gate stack structures 240 between the semiconductor layers 110, as shown in FIGS. 2A and 2B. In some other embodiments, the portions of the metal gate stack structures 260 between the semiconductor layers 120 are thinner than the portions of the metal gate stack structures 240 between the semiconductor layers 110.

Figure 3:
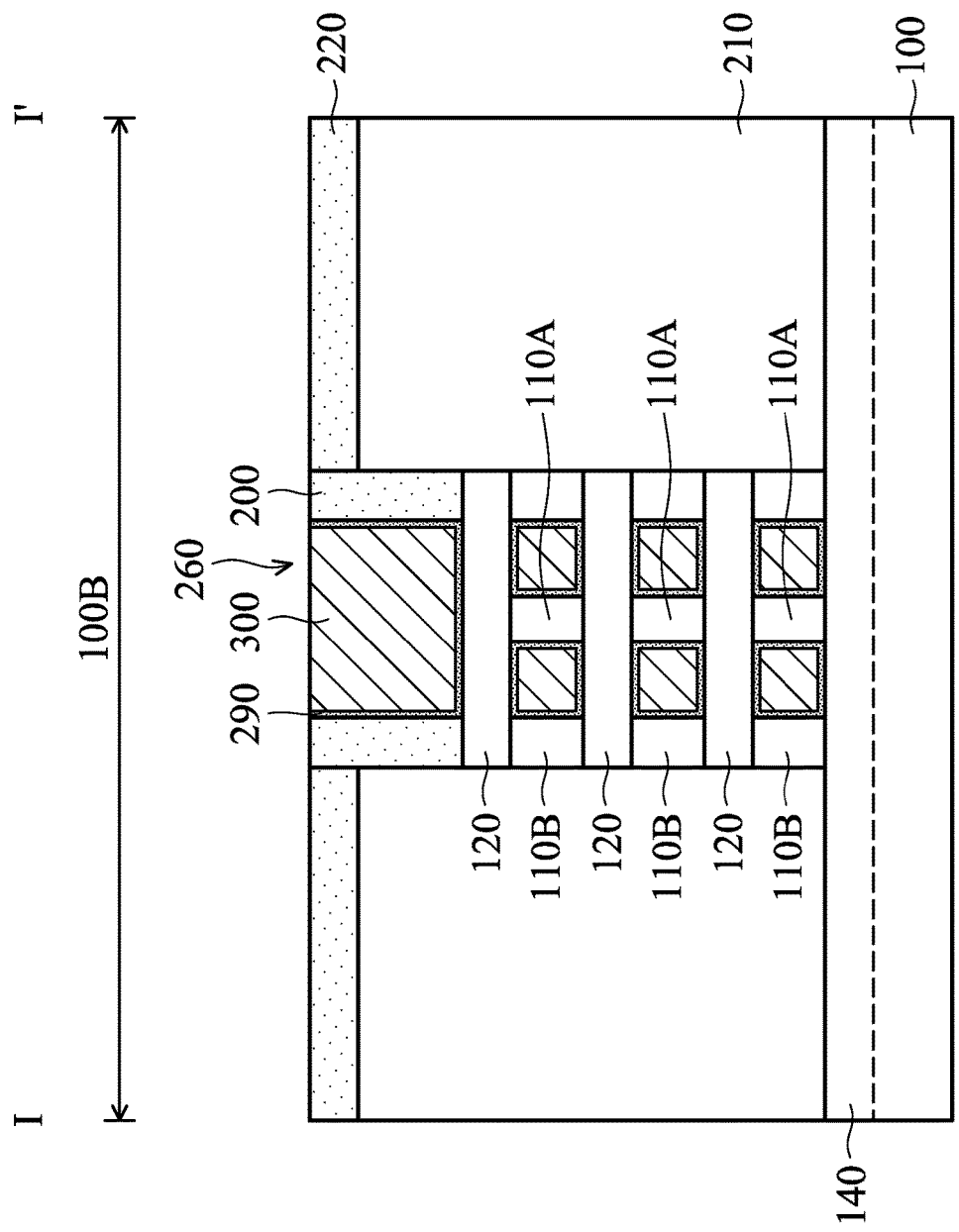
FIG. 3 is a cross-sectional view of a semiconductor device structure, in accordance with some embodiments.

Many variations and/or modifications can be made to embodiments of the disclosure. For example, the semiconductor device structure is not limited to including nanowires substantially embedded in gate stack structures. In some other embodiments, the semiconductor device structure includes nanowires partially surrounded by gate stack structures. FIG. 3 is a cross-sectional view of a semiconductor device structure, in accordance with some embodiments. As shown in FIG. 3, a semiconductor device structure similar to that shown in FIG. 2B is provided, in accordance with some embodiments. The materials and/or formation methods of the semiconductor device structure are illustrated in the embodiments mentioned above and are not repeated.

As shown in FIG. 3, the metal gate stack structures 260 partially encircle each of the semiconductor layers 120, in accordance with some embodiments. In some embodiments, the metal gate stack structures 260 partially encircle four or more sides of each of the semiconductor layers 120. For example, one or more first portions 110A partially remain between the spacer elements 200 in the regions 100B. As a result, the top surface and/or the bottom surface of the semiconductor layers 120 is partially covered by the metal gate stack structures 260.

In some embodiments, the remaining first portions 110A directly connect the semiconductor layers 120. The remaining first portions 110A may be used to provide stress or strain to channel regions. As a result, the carrier mobility of the device and the device performance are improved. In some embodiments, the remaining first portions 110A are separated from the metal gate electrode 300 by the gate dielectric layer 290.

Similarly, the metal gate stack structures 240 partially encircle each of the semiconductor layers 110, in accordance with some embodiments. For example, in some embodiments, one or more first portions 120A partially remain between the spacer elements 200 in the regions 100A.

Figure 4A:
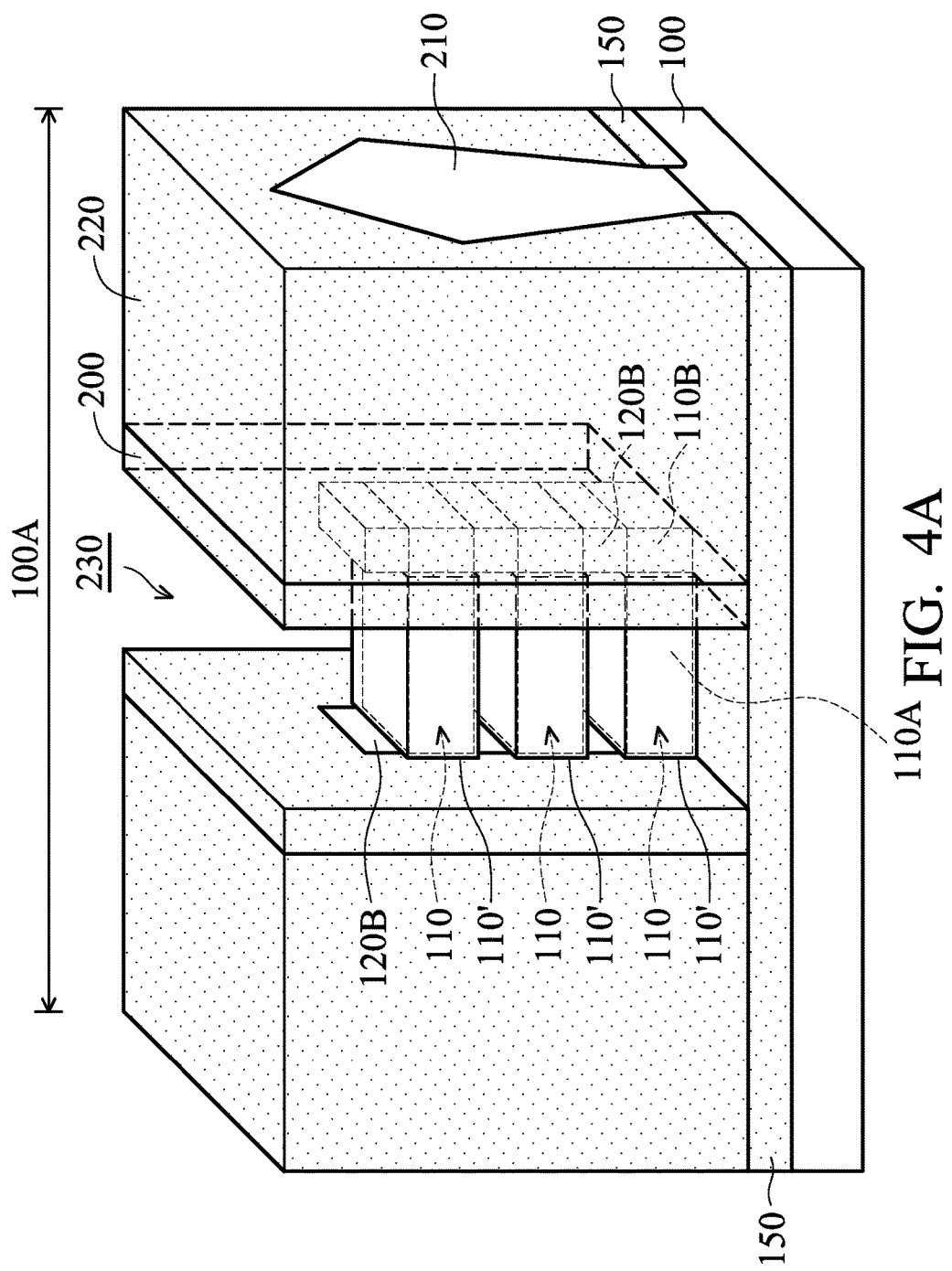
FIGS. 4A-4B are respectively a perspective view and a cross-sectional view of a semiconductor device structure, in accordance with some embodiments.
Figure 4B:
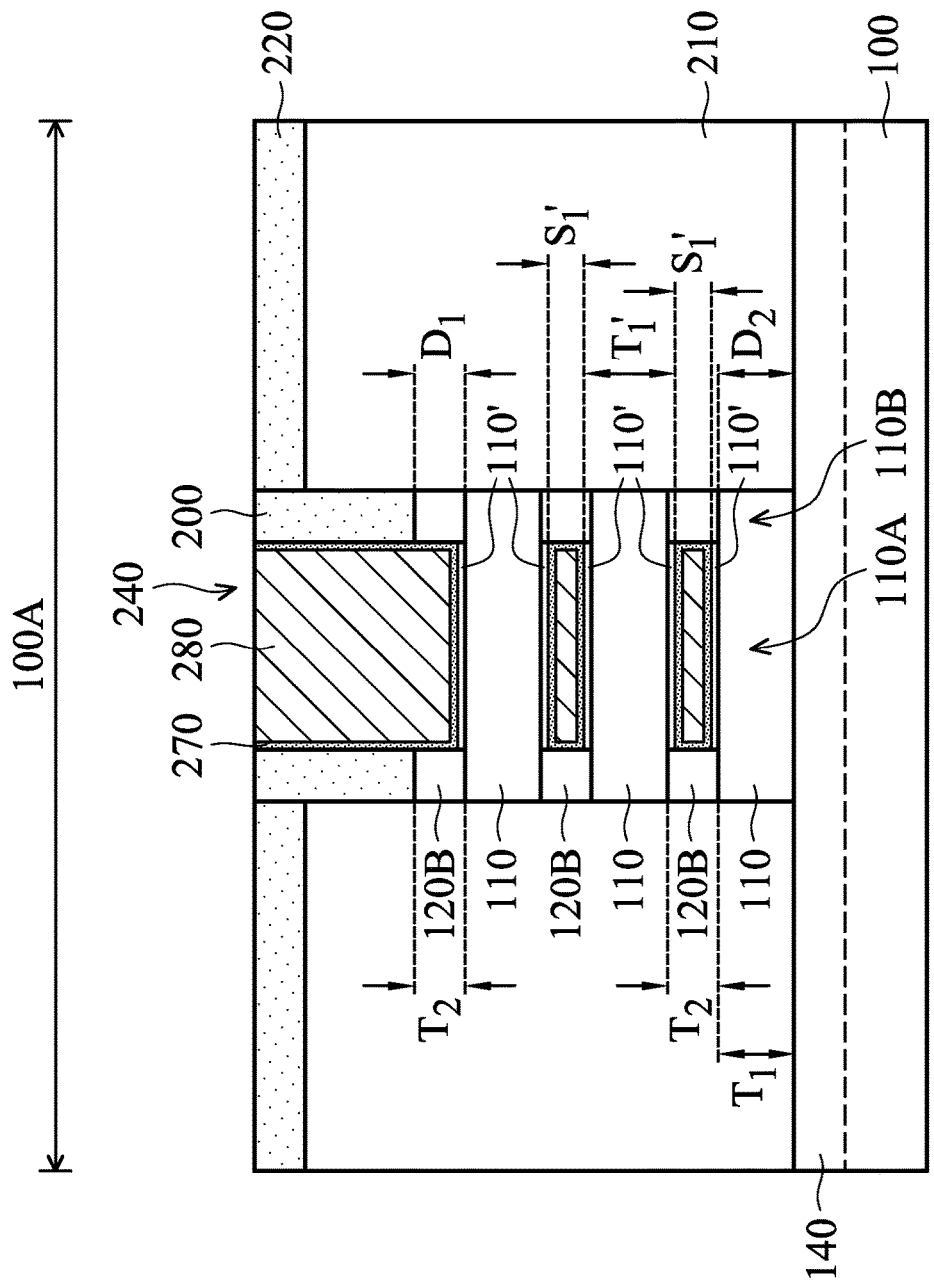

Many variations and/or modifications can be made to embodiments of the disclosure. For example, additional operations can be provided before the stages described in FIG. 1I. FIG. 4A is a perspective view of a semiconductor device structure, in accordance with some embodiments. FIG. 4B is a cross-sectional view showing a portion of the semiconductor device structure shown in FIG. 4A, in accordance with some embodiments. In some embodiments, the materials and/or formation methods of the semiconductor device structure shown in FIGS. 1A-1H can also be applied in the embodiments illustrated in FIGS. 4A and 4B, and are therefore not repeated.

As shown in FIGS. 4A and 4B, cladding layers 110' are deposited over the first portions 110A of the semiconductor layers 110 in the regions 100A, in accordance with some embodiments. The first portions 110A are illustrated as dashed lines in FIG. 4A, and the metal gate stack structures 240 are not shown in FIG. 4A for a better understanding of the structure.

The semiconductor layers 110 and the cladding layers 110' thereon may together form nanowires that serve as channel regions of FETs in the regions 100A. In accordance with some embodiments, the nanowires previously including the semiconductor layers 110 are expanded due to the deposition of the cladding layers 110'. As a result, the effective channel width ($W_{eff}$) of the nanowires is enlarged. Therefore, the device performance of the semiconductor device structure is enhanced. Furthermore, the $W_{eff}$ becomes tunable through the deposition of the cladding layers 110'. The levels of performance of multiple FETs (such as an NFET and a PFET) may be balanced successfully.

In some embodiments, the cladding layers 110' wrap the first portions 110A and are sandwiched between the first portions 110A and the metal gate stack structures 240. In some embodiments, the cladding layers 110' laterally overlap or are in direct contact with the second portions 120B of the semiconductor layers 120 below the spacer elements 200. In some other embodiments, the second portions 120B previously below the spacer elements 200 are removed. As a result, both the first portions 110A and the second portions 110B are embedded in the cladding layers 110'.

In some embodiments, there is an interface between the cladding layers 110' and the semiconductor layers 110. The interface may be observed using an electron microscope such as a transmission electron microscope (TEM). In some other embodiments, there is no detectable interface between the cladding layers 110' and the semiconductor layers 110. In some embodiments, there is a detectable interface between the cladding layers 110' and the second portions 120B of the semiconductor layers 120.

In some embodiments, the cross-sectional profile of the nanowires is rectangular, square, round, diamond, or another shape. In some embodiments, the nanowires including the semiconductor layers 110 and the cladding layers 110' have the same cross-sectional profile as that of the semiconductor layers 110. In some other embodiments, the nanowires including the semiconductor layers 110 and the cladding layers 110' have different cross-sectional profiles from that of the semiconductor layers 110.

In some embodiments, the thickness of the cladding layers 110' is in a range from about 0.5 nm to about 30 nm. In some other embodiments, the thickness of the cladding layers 110' is in a range from about 5 nm to about 15 nm. One of the semiconductor layers 110 and one of the cladding layers 110' thereon have a total thickness (or diameter) $T_1'$. In some embodiments, the total thickness $T_1'$ is in a range from about 0.5 nm to about 30 nm. In some other embodiments, the total thickness $T_1'$ is in a range from about 5 nm to about 15 nm. In some embodiments, the total thickness $T_1'$ is greater than the thickness $T_1$. In some other embodiments, the total thickness $T_1'$ is substantially the same as or less than the thickness $T_1$. For example, the dimension of the semiconductor layers 110 can change during operation. Accordingly, the total thickness $T_1'$ is not limited to being greater than the thickness $T_1$.

The nanowires including the semiconductor layers 110 and the cladding layers 110' are separated from one another by a spacing $S_1'$, as shown in FIG. 4B in accordance with some embodiments. In some embodiments, the spacing $S_1'$ is less than the spacing $S_1$. In some other embodiments, the spacing $S_1'$ is substantially the same as or greater than the spacing $S_1$. In some embodiments, the spacing $S_1'$ is less than the thicknesses $T_2$ of the second portions 120B. In some embodiments, the spacing $S_1'$ is less than the thicknesses $T_1$ of the first portions 110A and the second portions 110B. In some embodiments, the spacing $S_1'$ is less than the total thickness $T_1'$. In some other embodiments, the spacing $S_1'$ is substantially the same as or greater than the total thickness $T_1'$.

In some embodiments, the cladding layers 110' include silicon, silicon germanium, germanium tin, silicon germanium tin, or another suitable semiconductor material. In some embodiments, the cladding layers 110' and the semiconductor layers 110 include different materials. The cladding layers 110' may be used to provide stress or strain to channel regions. As a result, the carrier mobility of the device is improved. In some embodiments, the semiconductor layers 110 are made of silicon germanium, and the cladding layers 110' are made of silicon. In some other embodiments, the cladding layers 110' and the semiconductor layers 110 include the same material.

In some embodiments, the cladding layers 110' are deposited after the first portions 120A are removed and before the metal gate stack structures 240 are formed. In some embodiments, the cladding layers 110' are deposited using an epitaxial growth process. The epitaxial growth process may include a SEG process, a CVD process (e.g., a VPE process, a LPCVD process, and/or an UHV-CVD process), a molecular beam epitaxy process, another applicable process, or a combination thereof.

In some embodiments, the cross-sectional profile of the nanowires is a pillar with curved top and bottom surfaces. For example, multiple growth and etching processes and thermal treatments are performed so that the nanowires have a cross-sectional profile that is a pillar with curved top and bottom surfaces.

In accordance with some embodiments, a clean treatment is performed over the semiconductor layers 110 before the formation of the cladding layers 110'. As a result, cleaned surfaces of the semiconductor layers 110 are provided for being deposited with the cladding layers 110'. Therefore, the quality and reliability of the nanowires including the semiconductor layers 110 and the cladding layers 110' are improved. For example, the surfaces of the semiconductor layers 110 may be oxidized. The oxidized portions of the surfaces of the semiconductor layers 110 can be removed by the clean treatment.

In some embodiments, the semiconductor layers 110 shrink slightly or become thinner due to the clean treatment. In some embodiments, the semiconductor layers 110 are shaped to have curved surfaces or relatively rounded cross-sectional profiles after the clean treatment. In some other embodiments, the size and/or shape of the semiconductor layers 110 are constant.

In some embodiments, the clean treatment is performed using a solution. The solution may include HF solution, or another suitable solution. In some embodiments, the clean treatment is performed using a gas. The gas may include HF based gas, SiCoNi based gas, or another suitable gas. In some other embodiments, the clean treatment is performed using plasma. The plasma may include HF plasma, $NH_3$ plasma, a combination thereof, or another suitable plasma.

Figure 5A:
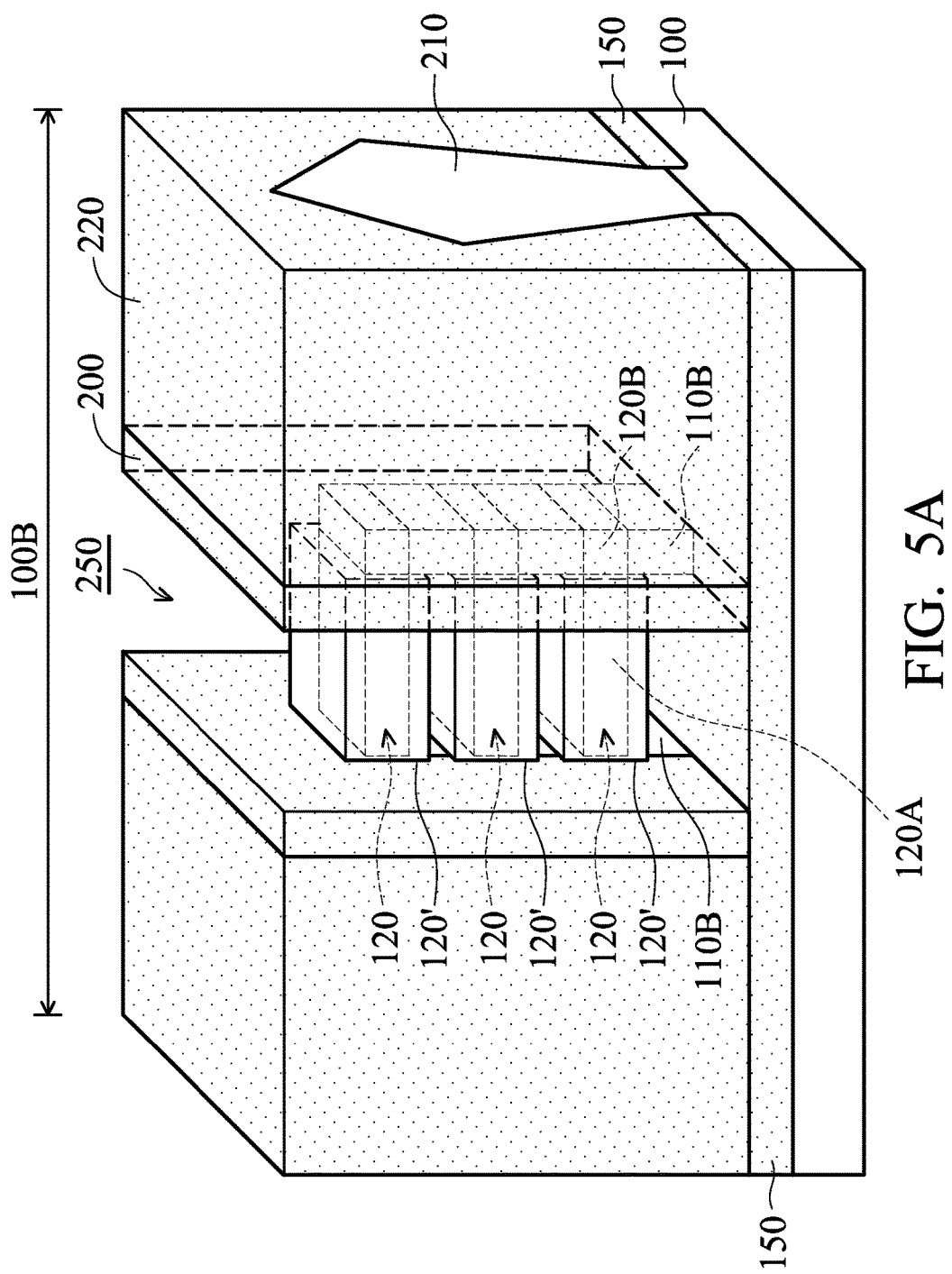
FIGS. 5A-5B are respectively a perspective view and a cross-sectional view of a semiconductor device structure, in accordance with some embodiments.
Figure 5B:
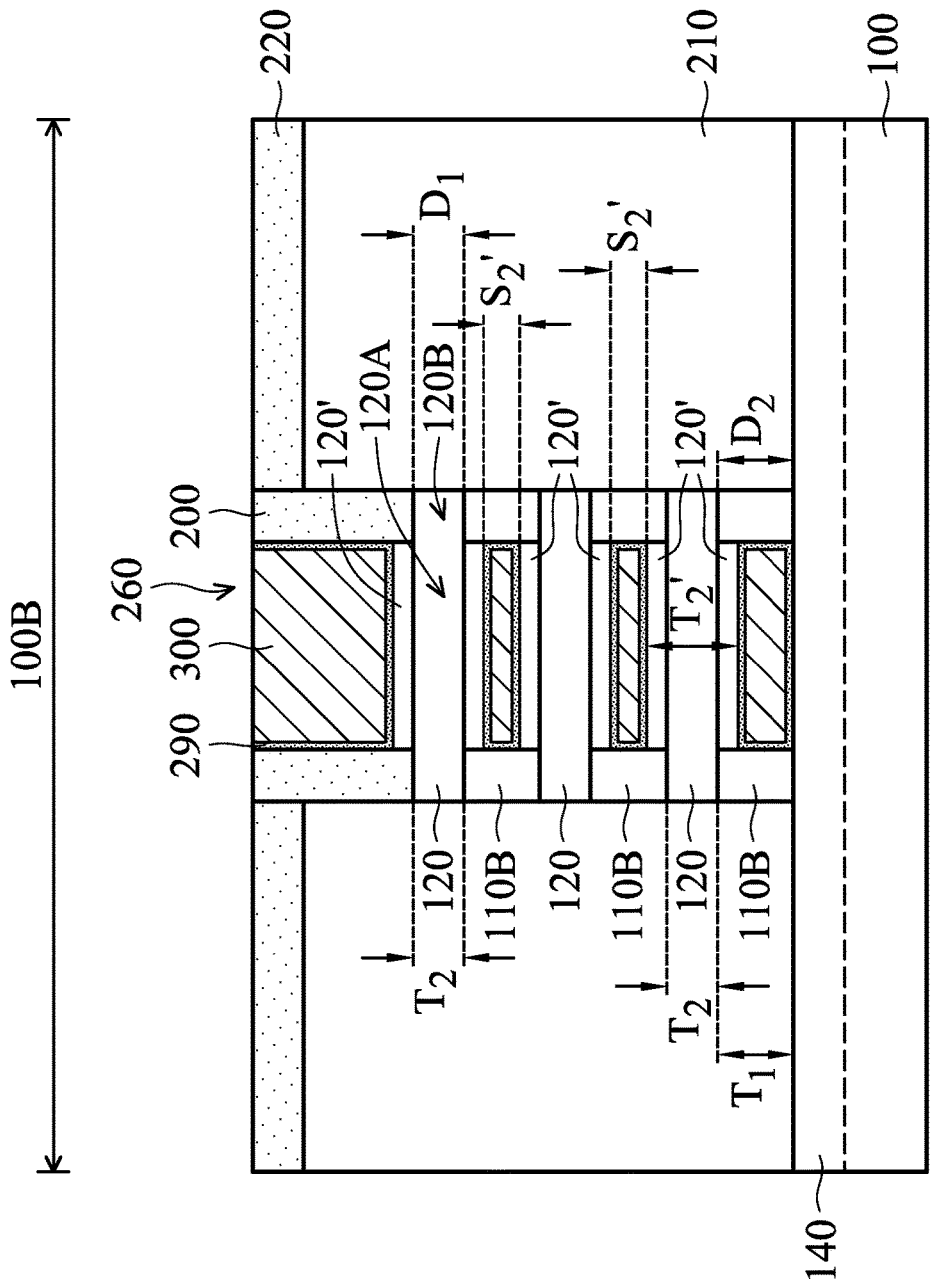

Many variations and/or modifications can be made to embodiments of the disclosure. For example, additional operations can be provided before the stages described in FIG. 1L. FIG. 5A is a perspective view of a semiconductor device structure, in accordance with some embodiments. FIG. 5B is a cross-sectional view showing a portion of the semiconductor device structure shown in FIG. 5A, in accordance with some embodiments. In some embodiments, the materials and/or formation methods of the semiconductor device structure shown in FIGS. 1A-1F and 1J-1L can also be applied in the embodiments illustrated in FIGS. 5A and 5B, and are therefore not repeated.

As shown in FIGS. 5A and 5B, cladding layers 120' are deposited over the first portions 120A of the semiconductor layers 120 in the regions 100B, in accordance with some embodiments. The first portions 120A are illustrated as dashed lines in FIG. 5A, and the metal gate stack structures 260 are not shown in FIG. 5A for a better understanding of the structure. The semiconductor layers 120 and the cladding layers 120' thereon form nanowires that serve as channel regions of FETs in the regions 100B.

The structure or arrangement of the cladding layers 120' is the same as or similar to that of the cladding layers 110' illustrated in the aforementioned embodiments and is not repeated. In some embodiments, the thickness of the cladding layers 120' is in a range from about 0.5 nm to about 30 nm. In some other embodiments, the thickness of the cladding layers 120' is in a range from about 5 nm to about 15 nm. One of the semiconductor layers 120 and one of the cladding layers 120' thereon have a total thickness (or diameter) $T_2'$. In some embodiments, the total thickness $T_2'$ is in a range from about 0.5 nm to about 30 nm. In some other embodiments, the total thickness $T_2'$ is in a range from about 5 nm to about 15 nm. In some embodiments, the total thickness $T_2'$ is greater than the thickness $T_2$. In some other embodiments, the total thickness $T_2'$ is substantially the same as or less than the thickness $T_2$.

The nanowires including the semiconductor layers 120 and the cladding layers 120' are separated from one another by a spacing $S_2'$, as shown in FIG. 5B in accordance with some embodiments. In some embodiments, the spacing $S_2'$ is less than the spacing $S_2$. In some other embodiments, the spacing $S_2'$ is substantially the same as or greater than the spacing $S_2$. In some embodiments, the spacing $S_2'$ is less than the thicknesses $T_1$ of the second portions 110B. In some embodiments, the spacing $S_2'$ is less than the thicknesses $T_2$ of the first portions 120A and the second portions 120B. In some embodiments, the spacing $S_2'$ is less than the total thickness $T_2'$. In some other embodiments, the spacing $S_2'$ is substantially the same as or greater than the total thickness $T_2'$.

The materials and/or formation methods of the cladding layers 120' are the same as or similar to that of the cladding layers 110' illustrated in the aforementioned embodiments and are not repeated. In some embodiments, the cladding layers 120' and the semiconductor layers 120 include different materials. In some embodiments, the semiconductor layers 120 are made of silicon, and the cladding layers 120' are made of silicon germanium. In some other embodiments, the cladding layers 120' and the semiconductor layers 120 include the same material. Similarly, a clean treatment is performed over the semiconductor layers 120 before the formation of the cladding layers 120', in accordance with some embodiments.

The aforementioned operations can be additionally provided before the stages described in FIGS. 1I and 1L. As shown in FIGS. 4A, 4B, 5A and 5B, cladding layers 110' and 120' are respectively deposited over the first portions 110A and 120A, in accordance with some embodiments. In some embodiments, the cladding layers 120' is thicker than the cladding layers 110'. In some other embodiments, the thickness of the cladding layers 120' is substantially the same as or less than the thickness of the cladding layers 110'.

In some embodiments, the total thickness $T_2'$ is substantially the same as the total thickness $T_1'$. In some other embodiments, the total thickness $T_2'$ is greater or less than the total thickness $T_1'$. In some embodiments, the spacing $S_2'$ is substantially the same as the spacing $S_1'$. In some other embodiments, the spacing $S_2'$ is greater or less than the spacing $S_1'$. In some embodiments, the spacing $S_1'$ is less than the total thickness $T_2'$. In some other embodiments, the spacing $S_1'$ is substantially the same as or greater than the total thickness $T_2'$. In some embodiments, the spacing $S_2'$ is less than the total thickness $T_1'$. In some other embodiments, the spacing $S_2'$ is substantially the same as or greater than the total thickness $T_1'$.

In some embodiments, the cladding layers 110' and 120' include different materials. In some other embodiments, the cladding layers 110' and 120' include the same material.

Embodiments of the disclosure form a semiconductor device structure with nanowires. Semiconductor layers with different materials and initial thicknesses are alternately deposited in multiple FET regions. As a result, the thinner semiconductor layer in a FET region is removed cleanly using an etchant with a sufficiently high etch selectivity of the thinner semiconductor layer to the thicker semiconductor layer. The thicker semiconductor layer in another FET region can be removed cleanly using another etchant because more surface areas of the thicker semiconductor layers are exposed to be etched. Accordingly, the loading effect of the selective etching processes for forming the nanowires is mitigated or eliminated.

Furthermore, regrowth operations can be performed over the nanowires. As a result, the nanowires are enlarged and/or reshaped. Therefore, the performance of the semiconductor device structure is improved, and the levels of performance of multiple FETs are significantly balanced.

In accordance with some embodiments, a semiconductor device structure is provided. The semiconductor device structure includes a first semiconductor layer and a second semiconductor layer vertically stacked over a semiconductor substrate. The first semiconductor layer and the second semiconductor layer comprise different materials. The semiconductor device structure also includes a gate stack covering a first portion of the first semiconductor layer. The semiconductor device structure further includes a spacer element over a sidewall of the gate stack. The spacer element covers the second semiconductor layer and a second portion of the first semiconductor layer. The thickness of the second semiconductor layer is different from the thickness of the second portion.

In accordance with some embodiments, a semiconductor device structure is provided. The semiconductor device structure includes first semiconductor layers over a semiconductor substrate. The first semiconductor layers are vertically spaced apart from each other by a first spacing. The semiconductor device structure also includes a first gate stack covering the first semiconductor layers. The semiconductor device structure further includes second semiconductor layers over the semiconductor substrate. The second semiconductor layers are vertically spaced apart from each other by a second spacing that is different from the first spacing. The material of the first semiconductor layers is different from that of the second semiconductor layers. In addition, the semiconductor device structure includes a second gate stack covering the second semiconductor layers.

In accordance with some embodiments, a method for forming a semiconductor device structure is provided. The method includes forming a first semiconductor layer and a second semiconductor layer vertically stacked over a semiconductor substrate in a first region and a second region. The first semiconductor layer and the second semiconductor layer comprise different materials and have different thicknesses. The method also includes removing the second semiconductor layer in the first region using a first etchant. The method further includes forming a first gate stack covering the first semiconductor layer in the first region. In addition, the method includes removing the first semiconductor layer in the second region using a second etchant. The method also includes forming a second gate stack covering the second semiconductor layer in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   first semiconductor layers and second semiconductor layers vertically stacked over a semiconductor substrate, wherein the first semiconductor layers and the second semiconductor layers comprise different materials;
   a gate stack surrounding a first portion of the first semiconductor layers; and
   a spacer element over a sidewall of the gate stack, wherein the spacer element covers the second semiconductor layers and a second portion of the first semiconductor layers, wherein a thickness of the first portion is substantially equal to a thickness of the second portion and is different from a thickness of the second semiconductor layers, wherein the second semiconductor layers and the spacer element sandwich the second portion of the first semiconductor layers, and the thickness of the first portion of the first semiconductor layers is equal to a distance between two immediately adjacent second semiconductor layers.

2. The semiconductor device structure as claimed in claim 1, wherein a distance between the spacer element and the first portion is different from the thickness of the first portion and the thickness of the second portion.

3. The semiconductor device structure as claimed in claim 1, wherein a distance between the semiconductor substrate and the first portion is different from the thickness of the first portion and the thickness of the second portion.

4. The semiconductor device structure as claimed in claim 1, further comprising a cladding layer between the first portion of the first semiconductor layers and the gate stack, wherein the cladding layer comprises a semiconductor material.

5. The semiconductor device structure as claimed in claim 4, wherein there is an interface between the cladding layer and the first portion.

6. The semiconductor device structure as claimed in claim 4, wherein the cladding layer adjoins the second semiconductor layers.

7. The semiconductor device structure as claimed in claim 1, further comprising source or drain structures on opposite sides of the first semiconductor layer, wherein the source or drain structures extend over a bottom surface of the spacer element.

8. The method for forming a semiconductor device structure as claimed in claim 1, wherein the first semiconductor layer is wider than the second semiconductor layer, and a width of the second semiconductor layer is substantially the same as a width of the spacer element.

9. The method for forming a semiconductor device structure as claimed in claim 1, further comprising a third semiconductor layer below the second semiconductor layer, wherein the gate stack further surrounds the third semiconductor layer, and a thickness of the third semiconductor layer is different from the thickness of the second semiconductor layer, and wherein the thickness of the third semiconductor layer is substantially equal to the thickness of the second portion between the second semiconductor layer and the spacer element.

10. The semiconductor device structure as claimed in claim 1, wherein the second portion of the first semiconductor layers is in direct contact with the second semiconductor layers.

11. A semiconductor device structure, comprising:
first semiconductor layers comprising first channel regions over a semiconductor substrate, wherein the first semiconductor layers are vertically spaced apart from each other by a first spacing;
a first gate stack surrounding the first channel regions of the first semiconductor layers;
second semiconductor layers comprising second channel regions over the semiconductor substrate, wherein the second semiconductor layers are vertically spaced apart from each other by a second spacing that is different from the first spacing, the first spacing is substantially equal to a thickness of the second channel regions, and a thickness of the first semiconductor layers is different from the first spacing, and wherein a material of the first semiconductor layers is different from that of the second semiconductor layers; and
a second gate stack surrounding the second channel regions of the second semiconductor layers.

12. The semiconductor device structure as claimed in claim 11, wherein the first semiconductor layers and the second semiconductor layers are at different levels.

13. The semiconductor device structure as claimed in claim 11, wherein a dimension of the first semiconductor layers is different from that of the second semiconductor layers.

14. The semiconductor device structure as claimed in claim 11, wherein the first gate stack and the second gate stack have different thicknesses.

15. The semiconductor device structure as claimed in claim 11, further comprising a cladding layer encircling one of the first semiconductor layers and covered by the first gate stack.

16. The semiconductor device structure as claimed in claim 11, further comprising a third semiconductor layer sandwiched between the first semiconductor layers and covered by the first gate stack, wherein a material of the third semiconductor layer is the same as that of the second semiconductor layers and is different from that of the first semiconductor layers.

17. The semiconductor device structure as claimed in claim 11, wherein a number of the first channel regions is equal to a number of the first semiconductor layers, and a number of the second channel regions is equal to a number of the second semiconductor layers, and wherein the thickness of the second channel regions is different from a thickness of the first channel regions.

18. A method for forming a semiconductor device structure, comprising:
forming a first semiconductor layer and a second semiconductor layer vertically stacked over a semiconductor substrate in a first region and a second region, wherein the first semiconductor layer and the second semiconductor layer comprise different materials, and the first semiconductor layer is thicker than the second semiconductor layer;
removing the second semiconductor layer in the first region using a first etchant such that a first channel region of the first semiconductor layer is suspended in the first region, wherein the first etchant has a first etch selectivity of the second semiconductor layer to the first semiconductor layer;
forming a first gate stack in the first region to surround the first channel region;
removing the first semiconductor layer in the second region using a second etchant such that a second channel region of the second semiconductor layer is suspended in the second region, wherein the second etchant has a second etch selectivity of the first semiconductor layer to the second semiconductor layer, and wherein the second etch selectivity is less than the first etch selectivity; and
forming a second gate stack in the second region to surround the second channel region after formation of the first gate stack.

19. The method for forming a semiconductor device structure as claimed in claim 18, further comprising performing an epitaxial growth process to form a cladding layer between the first gate stack and the first semiconductor layer in the first region after the removal of the second semiconductor layer.

20. The method for forming a semiconductor device structure as claimed in claim 18, further comprising enlarging the first semiconductor layer in the first region after the removal of the second semiconductor layer and before the formation of the first gate stack.

21. The method for forming a semiconductor device structure as claimed in claim 18, further comprising performing a clean treatment over the first semiconductor layer in the first region after the removal of the second semiconductor layer and before the formation of the first gate stack.

* * * * *